United States Patent
Ho et al.

(10) Patent No.: US 10,424,377 B2
(45) Date of Patent: Sep. 24, 2019

(54) SEMICONDUCTOR INTEGRATED CIRCUIT HAVING PROGRAMMABLE LOGIC DEVICE AND RESISTIVE CHANGE ELEMENTS

(71) Applicant: KABUSHIKI KAISHA TOSHIBA, Minato-ku (JP)

(72) Inventors: Yinghao Ho, Kawasaki (JP); Masato Oda, Yokohama (JP); Kosuke Tatsumura, Yokohama (JP); Shinichi Yasuda, Setagaya (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/907,711

(22) Filed: Feb. 28, 2018

(65) Prior Publication Data

US 2019/0080758 A1 Mar. 14, 2019

(30) Foreign Application Priority Data

Sep. 14, 2017 (JP) .................................. 2017-177033

(51) Int. Cl.
*G11C 13/00* (2006.01)
*H01L 23/525* (2006.01)
(Continued)

(52) U.S. Cl.
CPC ...... *G11C 13/0069* (2013.01); *G11C 13/0007* (2013.01); *G11C 13/0023* (2013.01);
(Continued)

(58) Field of Classification Search
CPC ............ G11C 13/0069; G11C 13/0007; G11C 2213/32; H01L 23/525; H01L 27/2436; H01L 27/2463; H01L 45/145
(Continued)

(56) References Cited

U.S. PATENT DOCUMENTS 8,934,293 B1 * 1/2015 Shepard .................. G11C 8/14
365/163
9,613,689 B1 * 4/2017 Takaki ............... G11C 13/0026
(Continued)

FOREIGN PATENT DOCUMENTS

JP 2010-044827 2/2010
JP 2012-123890 6/2012
(Continued)

*Primary Examiner* — Sung Il Cho
(74) *Attorney, Agent, or Firm* — Oblon, McClelland, Maier & Neustadt, L.L.P.

(57) ABSTRACT

A semiconductor integrated circuit according to an embodiment includes: first to third wirings; first current limiters corresponding to the first wirings; second current limiters corresponding to the second wirings; third current limiters corresponding to the third wirings; first drivers corresponding to the first current limiters; second drivers corresponding to the second current limiters; third drivers corresponding to the third current limiters; and a first array and a second array, wherein the first array comprising: fourth wirings corresponding to the first wirings; fifth wirings corresponding to the second wirings; first transistors corresponding to the first wirings; second transistors corresponding to the second wirings; and first resistive change elements arranged in intersecting areas of the fourth wirings and the fifth wirings, respectively, the first resistive change elements including a first terminal connected to corresponding one of the fourth wirings and a second terminal connected to corresponding one of the fifth wirings.

8 Claims, 13 Drawing Sheets

(51) Int. Cl.
  *H01L 27/24* (2006.01)
  *H01L 45/00* (2006.01)
(52) U.S. Cl.
  CPC ...... *G11C 13/0026* (2013.01); *G11C 13/0028* (2013.01); *H01L 23/525* (2013.01); *H01L 27/2436* (2013.01); *H01L 27/2463* (2013.01); *G11C 2013/0078* (2013.01); *G11C 2213/32* (2013.01); *G11C 2213/77* (2013.01); *H01L 45/145* (2013.01)
(58) Field of Classification Search
  USPC ........................................................ 365/148
  See application file for complete search history.

(56) References Cited

U.S. PATENT DOCUMENTS

| | | | | |
|---|---|---|---|---|
| 2003/0206473 | A1* | 11/2003 | Tran ................ | G11C 11/16 365/207 |
| 2008/0025066 | A1* | 1/2008 | Fasoli .............. | G11C 8/14 365/148 |
| 2008/0273369 | A1* | 11/2008 | Angerbauer ...... | G11C 11/5614 365/148 |
| 2010/0271862 | A1* | 10/2010 | Yoon ................ | G11C 8/10 365/148 |
| 2011/0026303 | A1* | 2/2011 | Choi ................. | G11C 7/04 365/148 |
| 2011/0032747 | A1* | 2/2011 | Yoon ................ | G11C 13/0007 365/148 |
| 2011/0242875 | A1 | 10/2011 | Nagashima et al. | |
| 2012/0147655 | A1 | 6/2012 | Lee | |
| 2012/0257437 | A1* | 10/2012 | Seko ................ | G11C 11/5678 365/148 |
| 2013/0308376 | A1* | 11/2013 | Tiburzi ............. | G11C 5/147 365/163 |
| 2014/0063888 | A1* | 3/2014 | Lee ................... | G11C 5/025 365/63 |
| 2014/0254242 | A1* | 9/2014 | Siau ................. | G11C 13/0026 365/148 |
| 2015/0380085 | A1 | 12/2015 | Park et al. | |
| 2016/0012890 | A1* | 1/2016 | Park ................. | G11C 13/0069 365/148 |
| 2016/0027477 | A1* | 1/2016 | Petti ................. | G11C 5/02 365/51 |
| 2016/0203860 | A1 | 7/2016 | Ho et al. | |
| 2018/0151225 | A1 | 5/2018 | Ho et al. | |

FOREIGN PATENT DOCUMENTS

| | | |
|---|---|---|
| JP | 2016-129318 | 7/2016 |
| JP | 2018-92980 A | 6/2018 |

* cited by examiner

FIG. 1

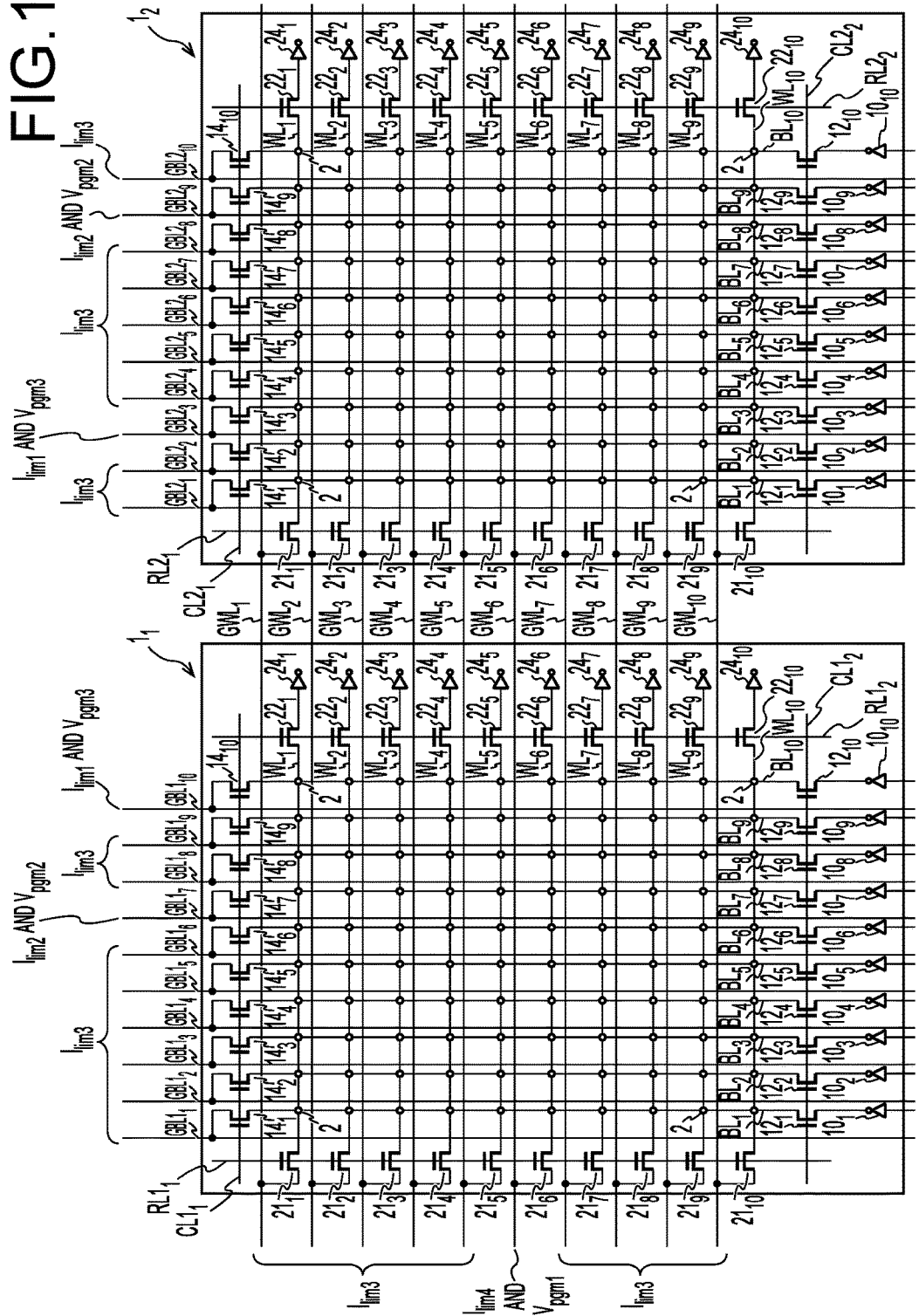

SEMICONDUCTOR INTEGRATED CIRCUIT HAVING PROGRAMMABLE LOGIC DEVICE AND RESISTIVE CHANGE ELEMENTS

CROSS REFERENCE TO RELATED APPLICATIONS

This application is based upon and claims the benefit of priority from the prior Japanese Patent Application No. 2017-177033 filed on Sep. 14, 2017, the entire contents of which are incorporated herein by reference.

FIELD

Embodiments described herein relate generally to a semiconductor integrated circuit.

BACKGROUND

A programmable logic device is a semiconductor integrated circuit in which rewriting of the circuit after production of a chip is possible. The programmable logic device includes a plurality of wirings and makes two wirings selected from these wirings into an electrically connected state or non-connected state. A switching circuit is used to perform control in such a manner that the two selected wirings become the connected state or the non-connected state. In the switching circuit, a transistor and a memory are used. This memory can be electrically programmed and on/off of the transistor is switched based on programmed information.

A cross-point resistive change element array is known, which uses a two-terminal resistive change element as a memory device with which the above-described switching circuit is realized. The resistive change element has two electrodes and a resistive change layer provided between the two electrodes. It is achieved to change a resistive state of the resistive change layer by applying a predetermined voltage between the two electrodes to switch electrical resistance between the two electrodes into a low resistive state or a high resistive state.

When programming the resistive change element, it is required to appropriately control the magnitude and application time of a program voltage to be applied to the electrodes. In addition, it is also important to control the magnitude of a current that flows through the resistive change element while applying the program voltage. As described, a semiconductor integrated circuit is known, which has a circuit for controlling a current flowing through the resistive change element while being programmed.

In the semiconductor integrated circuit, however, writing is performed, one by one, to the memory devices of a resistive change element array. For this reason, it is a problem for a semiconductor integrated circuit having large-scale resistive change element arrays to take time for writing.

BRIEF DESCRIPTION OF THE DRAWINGS

FIG. 1 is a circuit diagram showing a semiconductor integrated circuit according to a first embodiment.

FIG. 16 is a figure explaining a write operation in a second embodiment.

DETAILED DESCRIPTION

Figure 2:
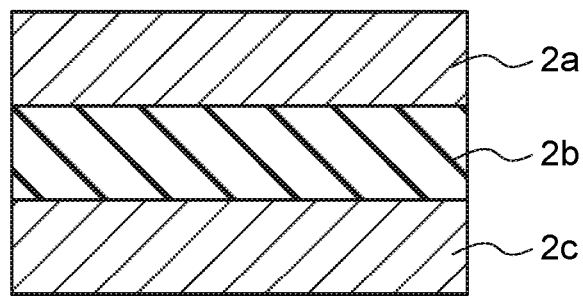
FIG. 2 is a sectional view showing a resistive change element.

A semiconductor integrated circuit according to an embodiment includes: first wirings; second wirings intersecting with the first wirings, respectively; third wirings intersecting with the first wirings, respectively; first current limiters arranged to correspond to the first wirings, at least one of the first current limiters being connected to corresponding one of the first wirings; second current limiters arranged to correspond to the second wirings, at least one of the second current limiters being connected to corresponding one of the second wirings; third current limiters arranged to correspond to the third wirings, at least one of the third current limiters being connected to corresponding one of the third wirings; first drivers arranged to correspond to the first current limiters, at least one of the first drivers being connected to corresponding one of the first current limiters; second drivers arranged to correspond to the second current limiters, at least one of the second drivers being connected to corresponding one of the second current limiters; third drivers arranged to correspond to the third current limiters, at least one of the third drivers being connected to corresponding one of the third current limiter; and a first array and a second array, wherein the first array comprises: fourth wirings arranged to correspond to the first wirings; fifth wirings arranged to correspond to the second wirings, the fifth wirings intersecting with the fourth wirings, respectively; first transistors arranged to correspond to the first wirings, one of a source and drain of at least one of the first transistors being connected to corresponding one of the first wirings, the other of the source and drain of the at least one of the first transistors being connected to corresponding one of the fourth wirings; second transistors arranged to correspond to the second wirings, one of a source and drain of at least one of the second transistors being connected to corresponding one of the second wirings, the other of the source and drain of the at least one of the second transistors being connected to corresponding one of the fifth wirings; and first resistive change elements arranged in intersecting areas of the fourth wirings and the fifth wirings, respectively, at least one of the first resistive change elements including a first terminal connected to corresponding one of the fourth wirings and a second terminal connected to corresponding one of the fifth wirings; and the second array comprises: sixth wirings arranged to correspond to the first wirings; seventh wirings arranged to correspond to the third wirings, the seventh wirings intersecting with the sixth wirings, respectively; third transistors arranged to correspond to the first wirings, one of a source and drain of at least one of the third transistors being connected to corresponding one of the first wirings, the other of the source and drain of the at least one of the third transistors being connected to corresponding one of the sixth wirings; fourth transistors arranged to correspond to the third wirings, one of a source and drain of at least one of the fourth transistors being connected to corresponding one of the third wirings, the other of the source and drain of the at least one of the fourth transistors being connected to corresponding one of the seventh wirings; and second resistive change elements arranged in intersecting areas of the sixth wirings and the seventh wirings, respectively, at least one of the second resistive change elements including a third terminal connected to corresponding one of the sixth wirings and a fourth terminal connected to corresponding one of the seventh wirings.

Hereinafter, embodiments will be explained with reference to the accompanying drawings.

First Embodiment

Figure 1:
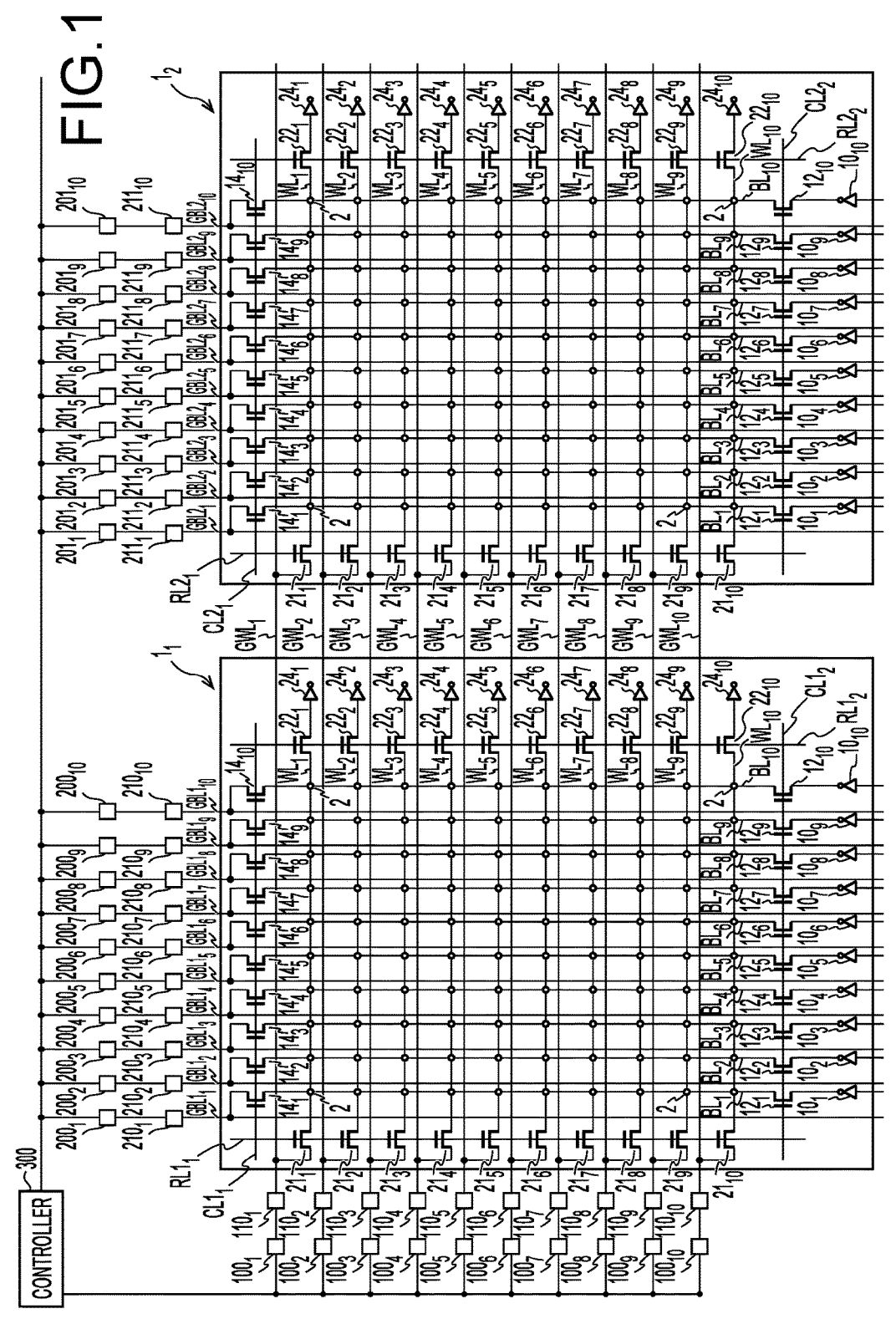

FIG. 1 shows a semiconductor integrated circuit according to a first embodiment. The semiconductor integrated circuit according to the first embodiment includes resistive change element arrays $1_1$, $1_2$, drivers $100_1$ to $100_{10}$, current limiters $110_1$ to $110_{10}$, drivers $200_1$ to $200_{10}$, current limiters $210_1$ to $210_{10}$, drivers $201_1$ to $201_{10}$, current limiters $211_1$ to $211_{10}$, and a controller 300.

Resistive change element arrays $1_i$ (i=1, 2) each includes resistive change elements 2 arranged in a matrix form of 10 rows and 10 columns, inverters $10_1$ to $10_{10}$, cut-off transistors $12_1$ to $12_{10}$, cut-off transistors $14_1$ to $14_{10}$, cut-off transistors $21_1$ to $21_{10}$, cut-off transistors $22_1$ to $22_{10}$, inverters $24_1$ to $24_{10}$, bit lines $BL_1$ to $BL_{10}$, and word lines $WL_1$ to $WL_{10}$. The bit lines $BL_1$ to $BL_{10}$ three-dimensionally intersect with the word lines $WL_1$ to $WL_{10}$, respectively. Here, an expression "a wiring A and a wiring B three-dimensionally intersect with each other" means that the wiring A and the wiring B are arranged in different levels and intersect with each other when viewed from above.

Each resistive change element 2 has a first terminal and a second terminal. In each resistive change element array $1_i$ (i=1, 2), a resistive change element 2, which is disposed in an i-th (i=1, . . . , 10) row and a j-th (j=1, . . . ,) column, is connected to a word line $WL_i$ at its first terminal and connected to a bit line $BL_j$ at its second terminal.

The word line $WL_i$ (i=1, . . . , 10) is connected at its one end to one of a source and a drain of a cut-off transistor $21_i$ and connected at its other end to one of a source and a drain of a cut-off transistor $22_i$. A bit line $BL_j$ (j=1, . . . ,) is connected at its one end to one of a source and a drain of a cut-off transistor $12_j$ and connected at its other end to one of a source and a drain of a cut-off transistor $14_j$. The other of the source and drain of the cut-off transistor $21_i$ (i=1, . . . , 10) is connected to a global word line $GWL_i$. The other of the source and drain of the cut-off transistor $22_i$ (i=1, . . . , 10) is connected to an input terminal of an inverter $24_i$. The resistive change element arrays $1_1$ and $1_2$ each output information, which is stored in a resistive change element 2 in the i-th row of each array, from an output terminal of the inverter $24_i$ (i=1, . . . , 10). The resistive-change element selection is performed based on an input signal input to each input terminal of the inverters $10_1$ to $10_{10}$, which will be described later.

Global word lines $GWL_i$ (i=1, . . . , 10) are arranged over the resistive change element arrays $1_1$ and $1_2$, and each global word line $GWL_i$ is driven by a driver $100_i$ via a current limiter $110_i$. In detail, a resistive change element 2 in the i-th (i=1, . . . , 10) row of each of the resistive change element arrays $1_1$ and $1_2$ is driven by the driver $100_i$ via the current limiter $110_i$, global word line $GWL_i$, and cut-off transistor $21_i$.

In each of the resistive change element arrays $1_1$ and $1_2$, the other of the source and drain of the cut-off transistor $12_j$ (j=1, . . . , 10) is connected to an output terminal of an inverter $10_j$, and an input signal is input to an input terminal of the inverter.

In the resistive change element $1_1$, the other of the source and drain of the cut-off transistor $14_j$ (j=1, . . . , 10) is connected to a global bit line $GBL1_j$. The global bit line $GBL1_j$ (j=1, . . . , 10) is driven by a driver $200_j$ via a current limiter $210_j$. In the resistive change element $1_2$, the other of the source and drain of the cut-off transistor $14_j$ (j=1, . . . , 10) is connected to a global bit line $GBL2_j$. The global bit line $GBL2_j$ (j=1, . . . , 10) is driven by a driver $201_j$ via a current limiter $211_j$. Global word lines $GWL_1$ to $GWL_{10}$ three-dimensionally intersect with global bit lines $GBL1_1$ to $GBL1_{10}$, and also three-dimensionally intersect with global bit lines $GBL2_1$ to $GBL2_{10}$.

In the present embodiment, the resistive change element arrays are arranged in a 1-row and 2-column matrix. When m is a natural number of 2 or more, and, if the resistive change element arrays are arranged in an m-row and 2-column matrix, the global bit lines $GBL1_j$ (j=1, . . . , 10) are arranged over the resistive change element arrays of the first column and driven by the driver $200_j$ via the current limiter $210_j$. In detail, a resistive change element 2 in the j-th (j=1, . . . , 10) column of each resistive change element array of the first column is driven by the driver $200_j$ via the current limiter $210_j$, global bit line $GBL1_j$, and cut-off transistor $14_j$. The global bit lines $GBL2_j$ (j=1, . . . , 10) are arranged over the resistive change element arrays of the second column and driven by the driver $201_j$ via the current limiter $211_j$. In detail, a resistive change element 2 in the j-th (j=1, . . . , 10) column of each resistive change element array of the second column is driven by the driver $201_j$ via the current limiter $211_j$, global bit line $GBL2_j$, and cut-off transistor $14_j$.

The drivers $100_1$ to $100_{10}$, drivers $200_1$ to $200_{10}$, and drivers $201_1$ to $201_{10}$ are controlled by the controller 300. In detail, the controller 300 applies a voltage to the word line $WL_i$ (i=1, . . . , 10) via the driver $100_i$, current limiter $110_i$, global word line $GWL_i$, and cut-off transistor $21_i$. Likewise, the controller 300 applies a voltage to the bit line $BL_j$ (j=1, . . . , 10) of the resistive change element array $1_1$ via the driver $200_j$, current limiter $210_j$, global bit line $GBL1_j$, and cut-off transistor $14_j$, and also applies a voltage to the bit line $BL_j$ of the resistive change element array $1_2$ via the driver $201_j$, current limiter $210_j$, global bit line $GBL2_j$, and cut-off transistor $14_j$.

In the resistive change element array $1_1$, a control signal $CL1_2$ is input to gates of the cut-off transistors $12_1$ to $12_{10}$, a control signal $CL1_1$ is input to gates of the cut-off transistors $14_1$ to $14_{10}$, and a control signal $RL1_2$ is input to gates of the cut-off transistors $22_1$ to $22_{10}$.

Likewise, in the resistive change element array $1_2$, a control signal $CL2_2$ is input to gates of the cut-off transistors $12_1$ to $12_{10}$, a control signal $CL2_1$ is input to gates of the cut-off transistors $14_1$ to $14_{10}$, and a control signal $RL2_2$ is input to gates of the cut-off transistors $22_1$ to $22_{10}$.

Specific Example of Resistive Change Element

FIG. 2 shows an example of the resistive change element 2. The resistive change element 2 includes an upper electrode 2a, a lower electrode 2c, and a resistive change layer 2b disposed between the upper electrode 2a and the lower electrode 2c.

The resistive change layer 2b may, for example, be a metal oxide such as a titanium oxide, hafnium oxide, tantalum oxide, and aluminum oxide, or a metal oxynitride such as a titanium oxynitride, hafnium oxynitride, tantalum oxynitride, and aluminum oxynitride. The resistive change layer 2b may further be a semiconductor oxide such as a silicon oxide, a semiconductor nitride such as a silicon nitride or a semiconductor oxynitride such as a silicon oxynitride. Furthermore, the resistive change layer 2b may be a semiconductor material such as amorphous silicon. Moreover, the resistive change layer 2b may have a laminated structure of the above-listed materials laminated with one another.

In the resistive change element 2, the electrical resistance between the electrodes 2a and 2c can be changed by applying a predetermined voltage between the electrodes. Here, changing the resistance of the resistive change element 2 from a high resistive state to a low resistive state is referred to as setting and changing the resistance of the resistive change element 2 from the low resistive state to the high resistive state is referred to as resetting. A voltage required to set the resistive change element 2 is referred to as a set voltage and a voltage required to reset the resistive change element 2 is referred to as a reset voltage.

Figure 3:
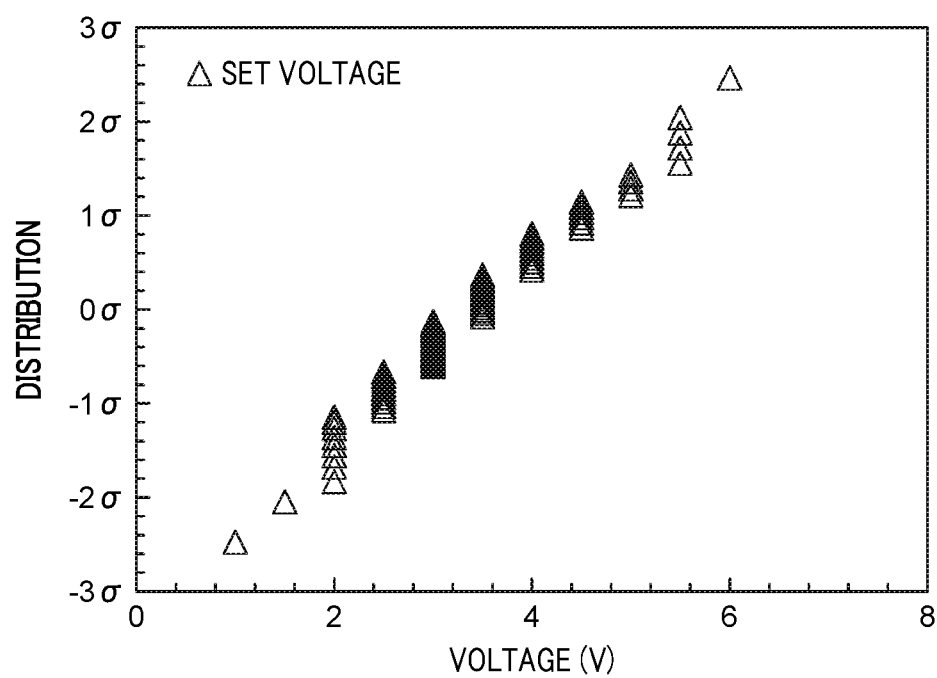
FIG. 3 is a diagram showing variation in set voltage of a resistive change element.

It is preferable for the resistive change element 2, which is to be used in the semiconductor integrated circuit of the present embodiment, to have a large difference between a resistance value in the high resistive state and a resistance value in the low resistive state. For example, it is preferable for the resistance value in the high resistive state to be 1 GΩ and for the resistance value in the low resistive state to be 10 KΩ. However, a resistive change element having a resistance value of 1 GΩ in the high resistive state shows a large variation in set voltage. This is explained with reference to FIG. 3. FIG. 3 is a diagram showing a result of measurement of the set voltage (V) with repeated set and reset operations to one resistive change element. In FIG. 3, the abscissa indicates an applied voltage and the ordinate indicates a multiple of deviation (σ) that expresses the degree of variation in set voltage. The applied voltage is varied from 1 V to 6 V by an increment of 0.5 V. As understood from FIG. 3, the set voltage shows a large variation. Therefore, a non-selected resistive change element in the resistive change element arrays of the semiconductor integrated circuit shown in FIG. 1 may erroneously operate even in the case where a write inhibit voltage Vinh (for example, a half of a program voltage (write voltage) Vpgm), which will be described later, is applied to the non-selected resistive change element. For this reason, known writing methods cannot be used. Accordingly, it is performed, not only to apply the write voltage Vpgm and the write inhibit voltage Vinh to selected and non-selected resistive change elements, respectively, but also to limit currents flowing through the resistive change elements.

When applying the set or reset voltage to a resistive change element 2 connected to the word line $WL_i$ (i=1, . . . , 10), the current limiter $110_i$ limits a current flowing through the resistive change element 2 while being programmed to a specific value (limited current value) or smaller, for the purpose of restricting a resistance value variation of the resistive change element 2 after programmed or preventing irreversible destruction of the resistive change element 2.

When applying the set or reset voltage to a resistive change element 2 connected to the bit line $BL_j$ (j=1, . . . , n), the current limiter $210_j$ or $211_j$ limits a current flowing through the resistive change element 2 while being programmed to a specific value (limited current value) or smaller, for the purpose of restricting a resistance value variation of the resistive change element 2 after programmed or preventing irreversible destruction of the resistive change element 2.

For example, in general, as the limited current value in setting is larger, the resistance value of a resistive change element after setting becomes smaller. On the contrary, in resetting, as the limited current value is sufficiently larger, a sufficiently large amount of current flows through the resistive change element to generate heat which changes the resistive state of the resistive change element to the high resistive state. In this way, different limited current values are used in setting and resetting.

First Specific Example of Current Limiter

Figure 4:
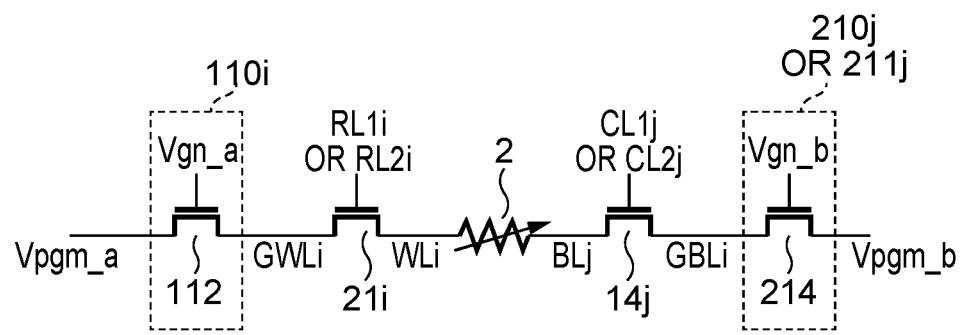
FIG. 4 is a circuit diagram showing a first specific example of a current limiter.

FIG. 4 shows a first specific example of the current limiter. In the first specific example and the following specific examples, the current limiter $110_i$ (i=1, . . . , 10) and the current limiter $210_j$ (j=1, . . . , 10) are connected to each other in the resistive change element array $1_1$, via the cut-off transistor $21_i$, the resistive change element 2 in the i-th row and the j-th column, and the cut-off transistor $14_j$, and also the current limiter $110_i$ (i=1, . . . , 10) and the current limiter $211_j$ (j=1, . . . , 10) are connected to each other in the resistive change element array $1_2$, via the cut-off transistor $21_i$, the resistive change element 2 in the i-th row and the j-th column, and the cut-off transistor $14_j$.

As shown in FIG. 4, in the first specific example, the current limiter $110_i$ (i=1, . . . , 10) includes an n-channel transistor 112, and the current limiter $210_j$ (j=1, . . . , 10) or $211_j$ includes an n-channel transistor 214. The transistor 112 is connected at one terminal of its source and drain to one of two output terminals of the driver $100_i$ (see FIG. 1), which will be described later, to be applied a program voltage Vpgm_a, the other terminal of its source and drain being connected to the first terminal of the resistive change element 2 via the global word line $GWL_i$, the cut-off transistor $21_i$, and the word line $WL_i$. The transistor 112 is applied a control voltage Vgn_a at its gate from the other output terminal of the driver $100_i$, the control voltage Vgn_a being controlled to vary a maximum current (limited current value) that passes through the transistor 112. In other words, the control voltage Vgn_a is controlled to set a plurality of limited current values, for example, two limited current values.

Moreover, as shown in FIG. 4, the current limiter $210_j$ (j=1, . . . , 10) or $211_j$ of the first specific example includes an n-channel transistor 214. The transistor 214 is connected at one terminal of its source and drain to the second terminal of the resistive change element 2 via the global bit line $GBL_j$, the cut-off transistor $14_j$, and the bit line $BL_j$. The transistor 214 is connected at the other terminal of its source and drain to one of the two output terminals of the driver $210_j$ or $211_j$ (see FIG. 1) to be applied the program voltage Vpgm_b. The transistor 214 is applied a control voltage Vgn_b at its gate from the other output terminal of the driver $210_j$ (j=1, ..., 10) or $211_j$, the control voltage Vgn_b being controlled to vary a maximum current (limited current value) that passes through the transistor 214. In other words, the control voltage Vgn_b is controlled to set a plurality of limited current values, for example, three limited current values. The program voltage Vpgm_a may be larger than the program voltage Vpgm_b. In this case, the control voltages Vgn_a and Vgn_b are larger than the program voltage Vpgm_a. Moreover, the program voltage Vpgm_a may be smaller than the program voltage Vpgm_b. In this case, the control voltages Vgn_a and Vgn_b are larger than the program voltage Vpgm_b.

Second Specific Example of Current Limiter

Figure 5:
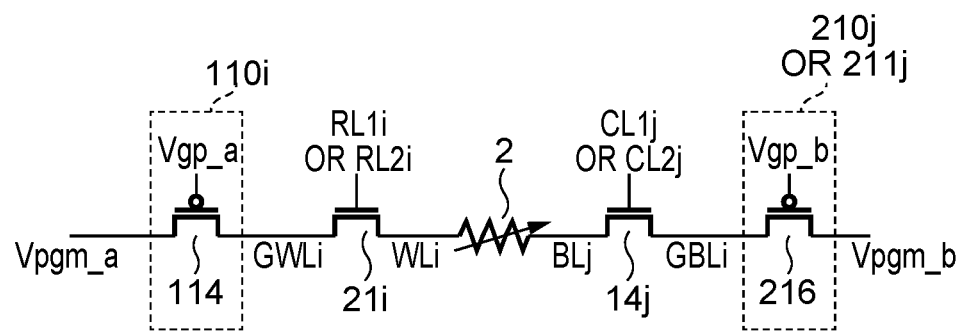
FIG. 5 is a circuit diagram showing a second specific example of the current limiter.

FIG. 5 shows a second specific example of the current limiter. The current limiter $110_i$ (i=1, ..., 10) of the second specific example has a configuration in which the n-channel transistor 112 of the current limiter $110_i$ of the first specific example shown in FIG. 4 is replaced with a p-channel transistor 114. A control voltage Vgp_a is applied to a gate of the transistor 114. With the control voltage Vgp_a being controlled, the transistor 114 sets a plurality of limited current values, for example, two limited current values.

Moreover, the current limiter $210_j$ (j=1, ..., 10) or $211_j$ of the second specific example has a configuration in which the n-channel transistor 214 of the current limiter $210_j$ or $211_j$ of the first specific example shown in FIG. 4 is replaced with a p-channel transistor 216. A control voltage Vgp_b is applied to a gate of the transistor 216. With the control voltage Vgp_b being controlled, the transistor 216 sets a plurality of limited current values, for example, three limited current values.

Also in the second specific example, the program voltage Vpgm_a may be larger than the program voltage Vpgm_b. In this case, the control voltages Vgp_a and Vgp_b are smaller than the program voltage Vpgm_b. Moreover, the program voltage Vpgm_a may be smaller than the program voltage Vpgm_b. In this case, the control voltages Vgp_a and Vgp_b are smaller than the program voltage Vpgm_a.

Third Specific Example of Current Limiter

Figure 6:
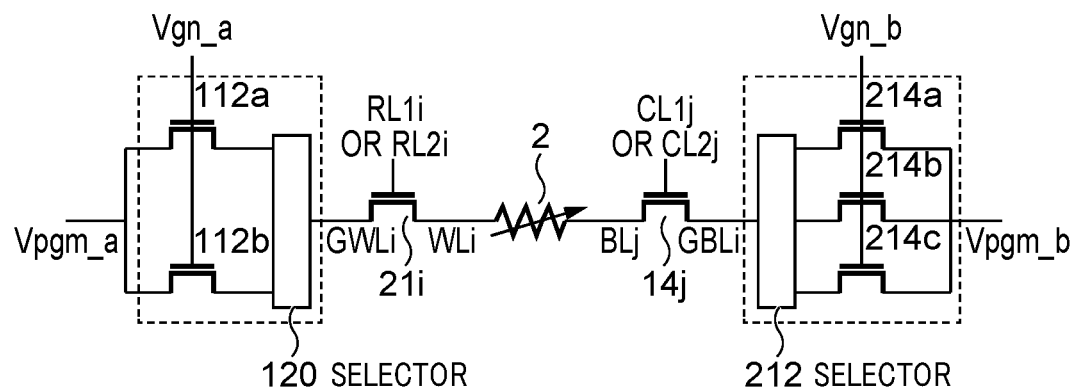
FIG. 6 is a circuit diagram showing a third specific example of the current limiter.

FIG. 6 shows a third specific example of the current limiter $110_i$ (i=1, ..., 10) and the current limiter $210_j$ (j=1, ..., 10) or $211_j$. The current limiter $110_i$ (i=1, ..., 10) of the third specific example includes parallel-connected two n-channel transistors 112a and 112b, and a selector 120. A control voltage Vgn_a is applied to each gate of the parallel-connected n-channel transistors 112a and 112b.

In the current limiter $110_i$ (i=1, ..., 10), the n-channel transistors 112a and 112b are applied a program voltage Vpgm_a at their each one terminal (one terminal of a source and drain) and connected to an input terminal of the selector 120 at their each other terminal (other terminal of the source and drain) thereof. In the current limiter $110_i$ (i=1, ..., 10), an output terminal of the selector 120 is connected to the global word line $GWL_i$, the cut-off transistor $21_i$, the word line $WL_i$, and the first terminal of the resistive change element 2. The program voltage Vpgm_a is output from one of two output terminals of the driver $100_i$.

One of the two transistors 112a and 112b is selected by the selector 120. The two transistors 112a and 112b are different from each other in drive power, which are designed so that different currents flow between their sources and drains when the same voltage Vgn_a is applied to their gates. In detail, with the control voltage Vgn_a being applied, the maximum current (limited current value) flowing through each of the two transistors 112a and 112b is controlled. The two transistors 112a and 112b are specifically fabricated so that at least one of the channel width, gate length, gate insulating-film thickness, channel impurity concentration, etc., is different between the transistors. A program voltage Vpgm_a is applied to each of the other terminals (the other terminal of the source and drain) of the n-channel transistors 112a and 112b. The control voltage Vgn_a is larger than the program voltage Vpgm_a.

The current limiter $210_j$ (j=1, ..., 10) or $211_j$ of the third specific example includes a selector 212 and parallel-connected three n-channel transistors 214a, 214b, and 214c. A control voltage Vgn_b is applied to gates of the parallel-connected n-channel transistors 214a, 214b, and 214c. The selector 212 is connected at its input terminal to the global bit line $GBL_j$ (j=1, ..., 10), the cut-off transistor $14_j$, and the second terminal of the resistive change element 2, and is connected at its output terminal to one terminal (one terminal of a source and drain) of each of the n-channel transistors 214a, 214b, and 214c. A program voltage Vpgm_b is applied to the other terminal (the other terminal of the source and drain) of each of the n-channel transistors 214a, 214b, and 214c. The program voltage Vpgm_b is output from one of two output terminals of the driver $210_j$ (j=1, ..., 10) or $211_j$. The control voltage Vgn_b is larger than the program voltage Vpgm_b.

One of the three transistors 214a, 214b, and 214c is selected by the selector 212. The three transistors 214a, 214b, and 214c are different from one another in drive power, which are designed so that different currents flow between their sources and drains when the same voltage is applied to their gates. In detail, with the control voltage Vgn_b being applied, the maximum current (limited current value) flowing through each of the three transistors 214a, 214b, and 214c is controlled.

Fourth Specific Example of Current Limiter

Figure 7:
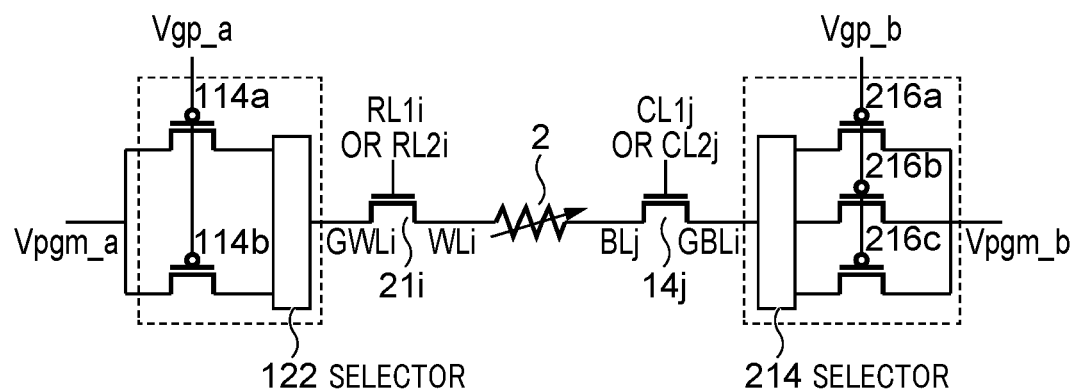
FIG. 7 is a circuit diagram showing a fourth specific example of the current limiter.

FIG. 7 shows a fourth specific example of the current limiter $110_i$ (i=1, ..., 10) and the current limiter $210_j$ or $211_j$ (j=1, ..., 10). The current limiter $110_i$ (i=1, ..., 10) of the fourth specific example has a configuration in which the n-channel transistors 112a and 112b of the current limiter of the third specific example shown in FIG. 6 are replaced with p-channel transistors 114a and 114b, respectively.

The current limiter $110_i$ (i=1, ..., 10) of the fourth specific example includes parallel-connected two p-channel transistors 114a and 114b, and a selector 122. A control voltage Vgp_a is applied to the gates of the parallel-connected p-channel transistors 114a and 114b. The control voltage Vgp_a is output from one of two output terminals of the driver $100_i$. In the current limiter $110_i$ (i=1, ..., 10) of the fourth specific example, the p-channel transistors 114a and 114b are applied a program voltage Vpgm_a at their each one terminal (one terminal of a source and drain) and connected to an input terminal of the selector 122 at their each other terminal (other terminal of the source and drain). In the current limiter $110_i$ (i=1, ..., 10), an output terminal of the selector 122 is connected to the global word line $GWL_i$, the cut-off transistor $21_i$, word line $WL_i$, and the first terminal of the resistive change element 2. The control voltage Vgp_a is smaller than the program voltage Vpgm_a to turn on the transistors 114a and 114b.

One of the two transistors 114a and 114b is selected by the selector 122. The two transistors 114a and 114b are different from each other in drive power, designed so that different currents flow between their sources and drains when the same voltage is applied to their gates. In other words, the maximum currents (limited current values) flowing through the two transistors 114a and 114b are different. Specifically, the two transistors 114a and 114b are fabricated so that at least one of the channel width, gate length, gate insulating-film thickness, channel impurity concentration, etc., is different between the transistors.

The current limiter $210_j$ (j=1, ..., 10) or $211_j$ of the fourth specific example includes a selector 214 and parallel-connected three p-channel transistors 216a, 216b, and 216c. A control voltage Vgp_a is applied to gates of the parallel-connected p-channel transistors 216a, 216b, and 216c. The selector 214 is connected at its input terminal to the second terminal of the resistive change element 2 via the global bit line $GBL_j$ and the cut-off transistor $14_j$. Moreover, the selector 214 is connected at its output terminal to one terminal (one terminal of a source and drain) of each of the p-channel transistors 216a, 216b, and 216c. A program voltage Vpgm_b is applied to the other terminal (the other terminal of the source and drain) of each of the p-channel transistors 216a, 216b, and 216c. The control voltage Vgp_b is smaller than the program voltage Vpgm_b to turn on the transistors 216a, 216b, and 216c.

One of the three transistors 216a, 216b, and 216c is selected by the selector 124. The selection is made based on a selection signal from the controller 300 shown in FIG. 1. The three transistors 216a, 216b, and 216c are different from one another in drive power, designed so that the maximum currents (limited current values) flowing between their sources and drains are different when a control voltage is applied to their gates. In other words, the limited current value flowing through the three transistors 216a, 216b, and 216c are different.

First Specific Example of Driver $200_j$ or $201_j$ (j=1, ..., 10)

Figure 8:
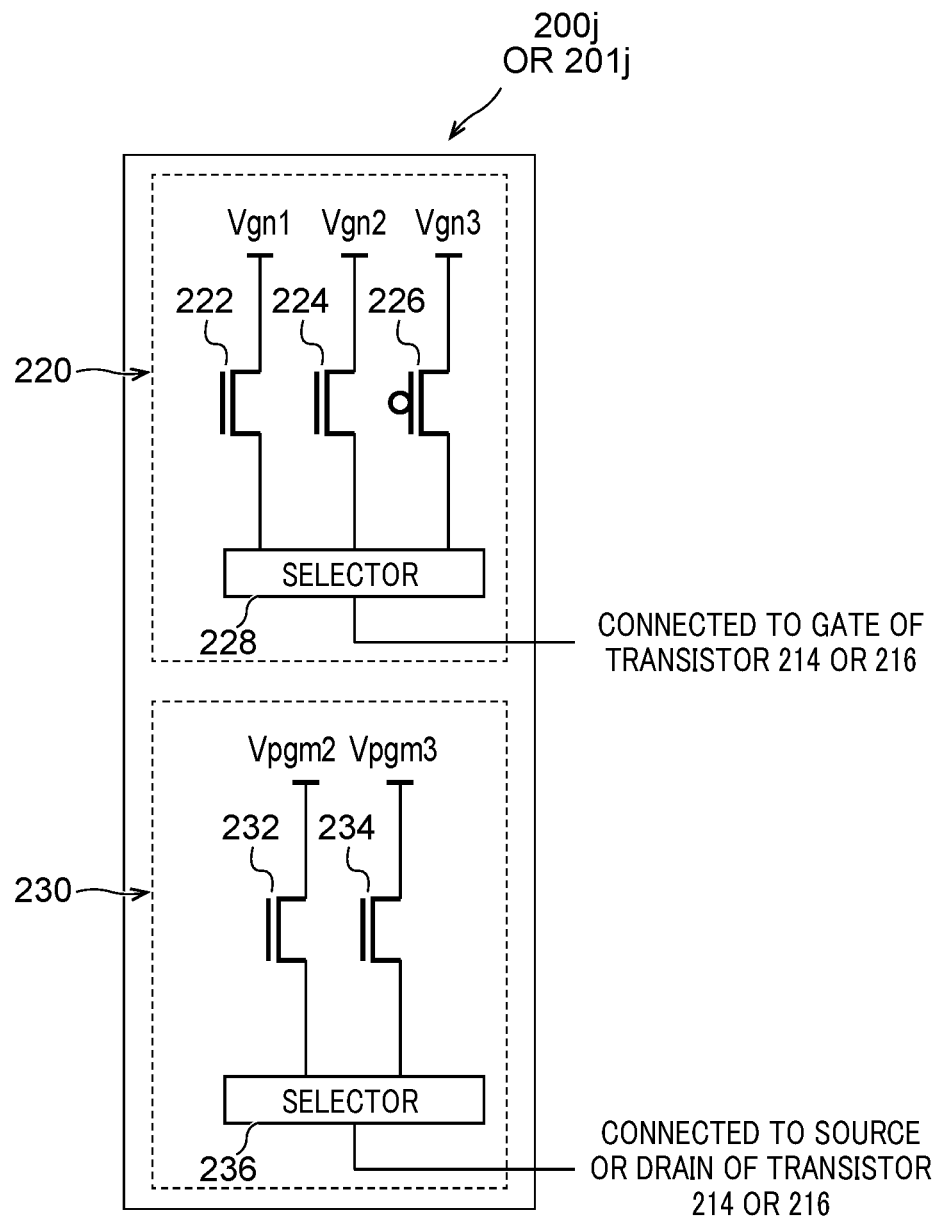
FIG. 8 is a circuit diagram showing a first specific example of a driver.

FIG. 8 shows a first specific example of the driver $200_j$ (j=1, ..., 10) or $201_j$. The first specific example of the driver $200_j$ (j=1, ..., 10) or $201_j$ is to drive either the current limiter $210_j$ or $211_j$ shown in FIG. 4 or FIG. 5 and includes a gate voltage generator 220 and a program voltage generator 230.

The gate voltage generator 220 generates a voltage to be applied to the gate of the transistor 214 or 216 of the current limiter $210_j$ (j=1, ..., 10) or $211_j$ and includes n-channel transistors 222, 224, and 226, and a selector 228. The transistors 222 and 224 are applied voltages Vgn1 and Vgn2 at their drains, respectively, and connected at their sources to a first and a second input terminal of the selector 228, respectively. The transistor 226 is applied a voltage Vgn3 at its source and connected at its drain to a third input terminal of the selector 228. The selector 228 selects one of the voltages Vgn1, Vgn2, and Vgn3 based on a control signal from the controller 300 shown in FIG. 1 and supplies the selected voltage to the gate of the transistor 214 of the current limiter $210_j$ (j=1, ..., 10) or to the gate of the transistor 216 of the current limiter $211_j$, from an output terminal of the selector 228. The voltage Vgn1 is used for current limitation in set operation of the resistive change element 2, the voltage Vgn2 is used for current limitation in reset operation of the resistive change element 2, and the voltage Vgn3 is used for current limitation to a non-selected resistive change element 2. In other words, in the present embodiment, the current limiter $210_j$ (j=1, ..., 10) or $211_j$ has three limited current values. The transistors 222, 224, and 226 receive at their gates a control signal from the controller 300 shown in FIG. 1. The transistors 222, 224, and 226 may be a p-channel transistor.

The program voltage generator 230 generates a program voltage to be applied to the source or drain of the transistor 214 or 216 of the current limiter $210_j$ (j=1, ..., 10) or $211_j$ and includes n-channel transistors 232 and 234, and a selector 236. The transistors 232 and 234 are applied voltages Vpgm2 and Vpgm3 at their drains, respectively, and connected at their sources to a first and a second input terminal of the selector 236, respectively. The selector 236 selects one of the voltages Vpgm2 and Vpgm3 based on a control signal from the controller 300 shown in FIG. 1 and supplies the selected voltage from its output terminal to the source or drain of the transistor 214 of the current limiter $210_j$ (j=1, ..., 10) or to the source or drain of the transistor 216 of the current limiter $211_j$. The voltage Vpgm2 is applied to a bit line for resetting the resistive change element 2 and the voltage Vpgm3 is applied to the bit line for setting the resistive change element 2. The transistors 232 and 234 receive at their gates a control signal from the controller 300 shown in FIG. 1. The transistors 232 and 234 may be a p-channel transistor. When a resistive change element with no forming operation required is used, it is enough to prepare application voltages for resetting and setting. However, when a resistive change element with forming operation required is used, it is required to prepare a forming operation voltage in the program voltage generator 230. In this case, the program voltage generator 230 requires three kinds of voltages, which requires three or more transistors. In other words, the program voltage generator 230 has at least two transistors for voltage generation.

First Specific Example of Driver 100i (i=1, ..., 10)

Figure 9:
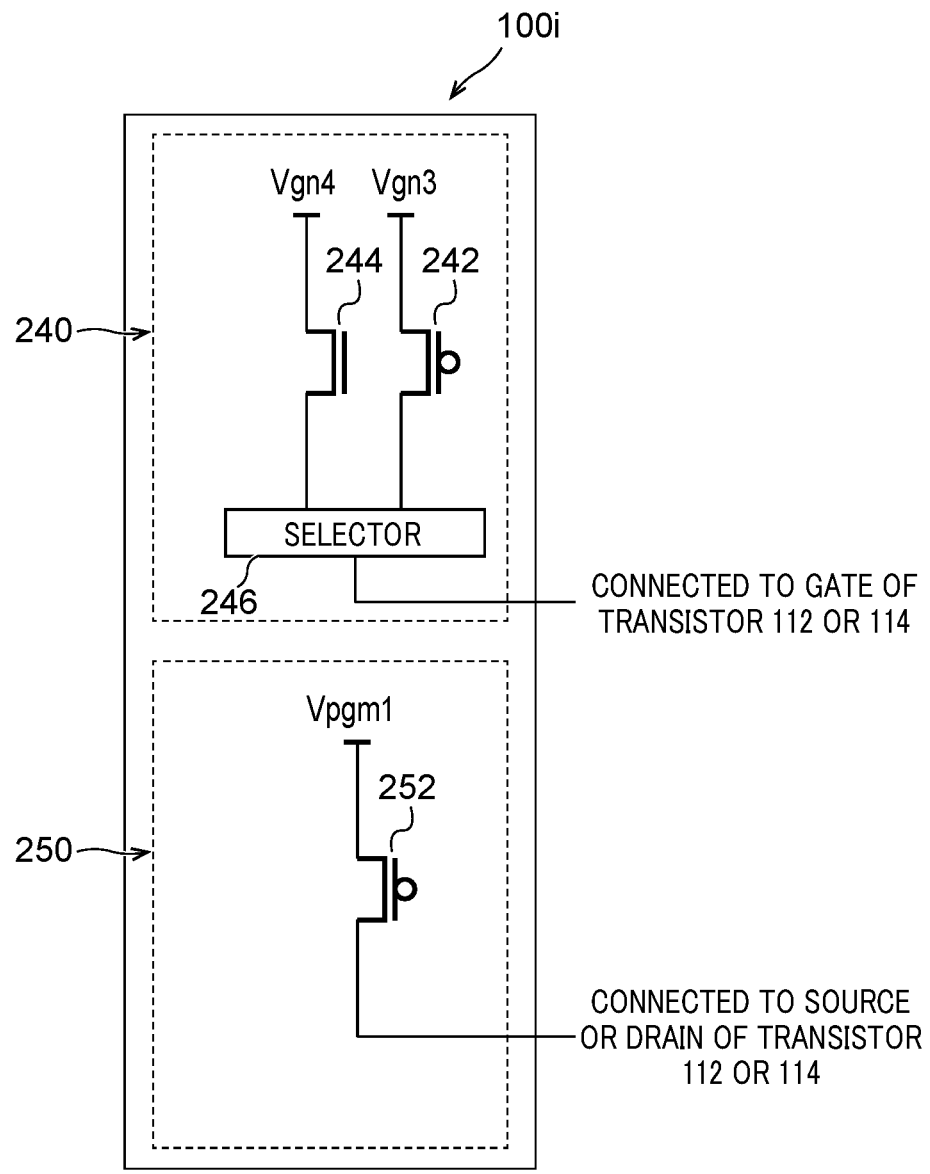
FIG. 9 is a circuit diagram showing a first specific example of a driver.

FIG. 9 shows a first specific example of the driver $100_i$ (i=1, ..., 10). The driver $100_i$ (i=1, ..., 10) of the first specific example is to drive the current limiter $110_i$ shown in FIG. 4 or FIG. 5 and includes a gate voltage generator 240 and a program voltage generator 250.

The gate voltage generator 240 includes two n-channel transistors 242 and 244, and a selector 246. The transistor 242 is applied a voltage Vgn3 at its source and connected at its drain to a first input terminal of the selector 246. The transistor 244 is applied a voltage Vgn4 at its drain and connected at its source to a second input terminal of the selector 246. The selector 246 selects one of the voltages Vgn3 and Vgn4 based on a control signal from the controller 300 shown in FIG. 1 and supplies the selected voltage to the gate of the transistor 112 or 114 of the current limiter $110_i$ (i=1, ..., 10). The voltage Vgn3 is used for current limitation to a non-selected resistive change element. The voltage Vgn4 is used for simultaneously operating a large number of resistive change elements. In detail, in the present embodiment, the current limiter $110_i$ (i=1, ..., 10) has two limited current values. The transistors 242 and 244 receive at their gates a control signal from the controller 300. The transistors 242 and 244 may be a p-channel transistor.

The program voltage generator 250 is to supply a program voltage to the source or drain of the transistor 112 or 114 of the current limiter $110_i$ (i=1, ..., 10) and has an n-channel transistor 252. The transistor 252 is applied a program voltage Vpgm1 at its source and connected at its drain to the source or drain of the transistor 112 or 114 of the current limiter $110_i$ (i=1, ..., 10). The transistor 252 receives at its gate a control signal from the controller 300 shown in FIG. 1. The transistor 252 may be a p-channel transistor.

Since the voltages to be applied to the resistive change elements are not limited on directivity, the program voltage generator 230 and the program voltage generator 250 are interchangeable. For example, in the case of Vpgm1=0V, Vpgm2=1.8 Vm, and Vpgm3=3.5V, the program voltage generator 230 may output Vpgm2 and Vpgm3, and the program voltage generator 250 may output Vpgm1. Or the program voltage generator 250 may output Vpgm2 and Vpgm3, and the program voltage generator 230 may output Vpgm1. The gate voltage generator 220 and the gate voltage generator 240 are non-interchangeable.

Second Specific Example of Driver $200_j$ or $201_j$ (j=1, . . . , 10)

Figure 10:
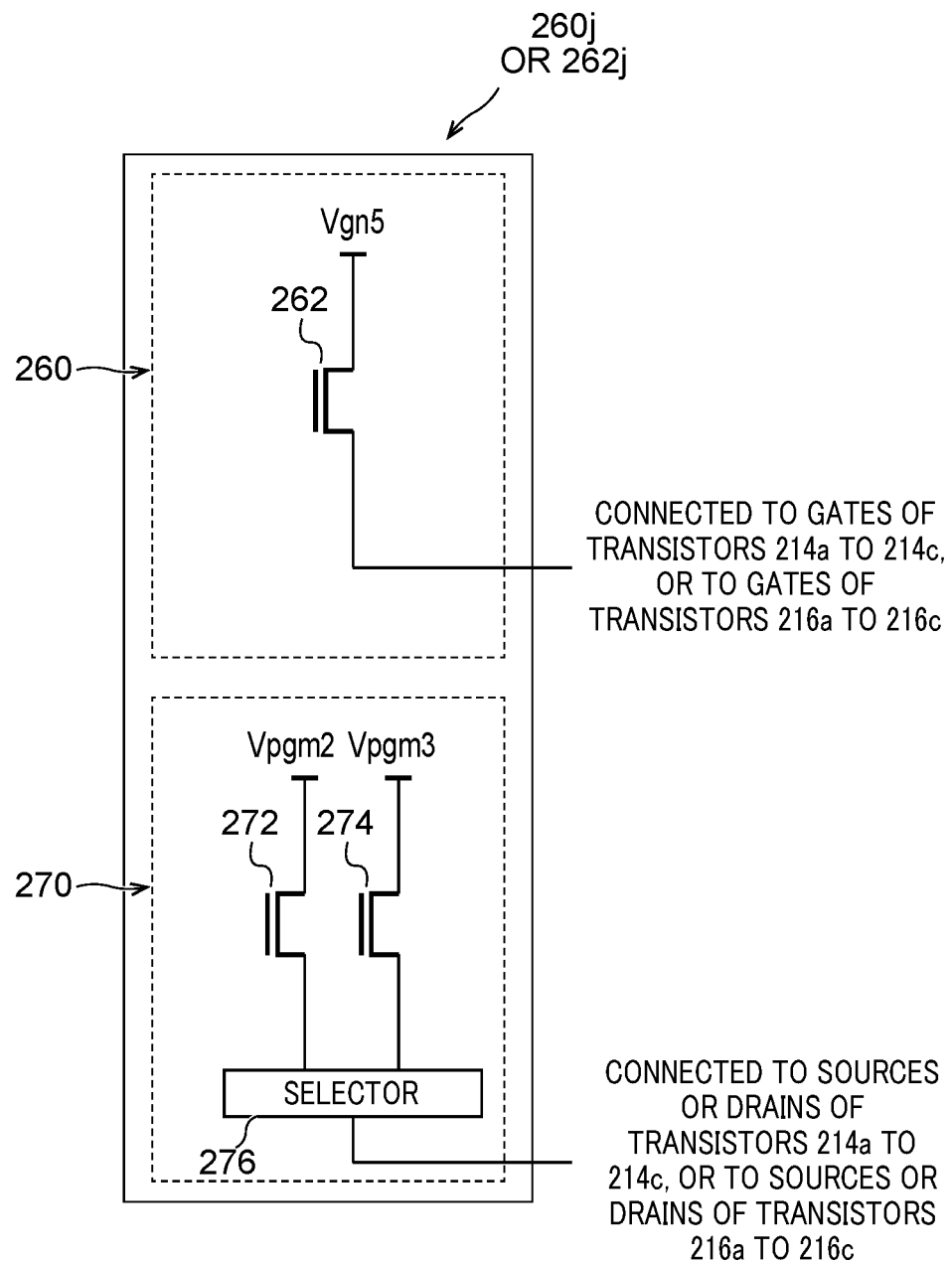
FIG. 10 is a circuit diagram showing a second specific example of a driver.

FIG. 10 shows a second specific example of the driver $200_j$ or $201_j$ (j=1, . . . , 10). The driver $200_j$ or $201_j$ (j=1, . . . , 10) of the second specific example is to drive the current limiter $210_j$ or $211_j$ shown in FIG. 6 or FIG. 7 and includes a gate voltage generator 260 and a program voltage generator 270.

The gate voltage generator 260 includes an n-channel transistor 262 and supplies a voltage Vgn5 to the gates of transistors 214a to 214c of or to the gates of transistors 216a to 216c of the current limiter $210_j$ (j=1, . . . , 10) or $211_j$. The transistor 262 is applied a voltage Vgn5 at its drain, connected at its source to the gates of the transistors 214a to 214c or to the gates of the transistors 216a to 216c, and receives at its gate a control signal from the controller 300 shown in FIG. 1. In the present embodiment, the current limiter $210_j$ (j=1, . . . , 10) or $211_j$ can set three limited current values. However, since the current limiter $210_j$ (j=1, . . . , 10) or $211_j$ shown in FIG. 6 or FIG. 7 has three transistors of different drive power, it is enough for the driver $200_j$ or $201_j$ to have one kind of gate application voltage. The transistor 262 may be a p-channel transistor.

The program voltage generator 270 includes n-channel transistors 272 and 274, and a selector 276, and supplies a program voltage to the sources or drains of the transistors 214a to 214c of or to the sources or drains of the transistors 216a to 216c of the current limiter $210_j$ (j=1, . . . , 10) or $211_j$ shown in FIG. 6 or FIG. 7. The transistor 272 is applied a program voltage Vpgm2 at its drain, connected at its source to a first input terminal of the selector 276, and receives at its gate a control signal from the controller 300 shown in FIG. 1. The transistor 274 is applied a program voltage Vpgm3 at its drain, connected at its source to a second input terminal of the selector 276, and receives at its gate a control signal from the controller 300 shown in FIG. 1. The selector 276 selects one of the program voltages Vpgm2 and Vpgm3 based on a control signal from the controller 300, and supplies the selected voltage to the sources or drains of the transistors 214a to 214c or to the sources or drains of the transistors 216a to 216c. The transistors 272 and 274 may be a p-channel transistor. The program voltage generator 270 includes two transistors because the application voltage may be of two or more kinds, like the program voltage generator 230.

Second Specific Example of Driver $100_i$ (i=1, . . . , 10)

Figure 11:
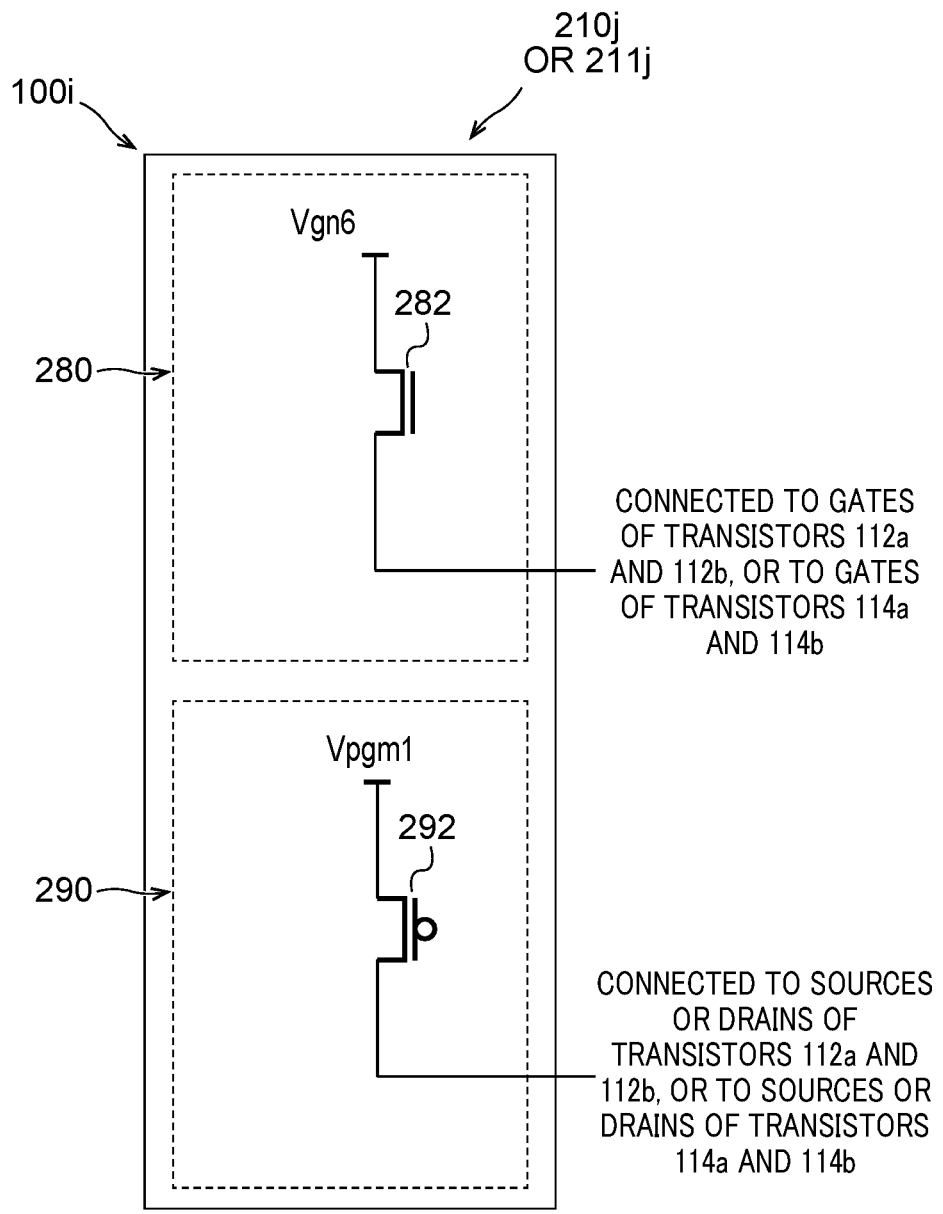
FIG. 11 is a circuit diagram showing a second specific example of a driver.

FIG. 11 shows a second specific example of the driver $100_i$ (i=1, . . . , 10). The driver $100_i$ (i=1, . . . , 10) of the second specific example is to drive the current limiter $110_i$ shown in FIG. 6 or FIG. 7 and includes a gate voltage generator 280 and a program voltage generator 290.

The gate voltage generator 280 includes an n-channel transistor 282 to generate a voltage to be applied to the gates of the transistors 112a and 112b of or to the gates of the transistors 114a and 114b of the current limiter $110_i$ (i=1, . . . , 10). The transistor 282 receives a voltage Vgn6 at its drain, connected at its source to the gates of the transistors 112a and 112b or to the gates of the transistors 114a and 114b, and receives at its gate a control signal from the controller 300 shown in FIG. 1. In detail, the voltage Vgn6 is applied to the gates of the transistors 112a and 112b or to the gates of the transistors 114a and 114b. The transistor 282 may be a p-channel transistor. In the present embodiment, the current limiter $110_i$ (i=1, . . . , 10) can set two kinds of limited current values. However, since the current limiter $110_i$ shown in FIG. 6 or FIG. 7 includes two transistors of different drive power, it is enough for the driver $100_i$ to have one kind of gate application voltage.

The program voltage generator 290 includes an n-channel transistor 292 and supplies a program voltage Vpgm1 to one of the source and drain of each of the transistors 112a and 112b of the current limiter $110_i$ (i=1, . . . , 10) or to one of the source and drain of each of the transistors 114a and 114b of the current limiter $110_i$ (i=1, . . . , 10). The transistor 292 receives a program voltage at its source, connected at its drain to one of the source and drain of each of the transistors 112a and 112b or to one of the source and drain of each of the transistors 114a and 114b, and receives at its gate a control signal from the controller 300 shown in FIG. 1. Since the voltages to be applied to the resistive change elements are not limited on directivity, the program voltage generator 270 and the program voltage generator 290 are interchangeable. The transistor 252 may be a p-channel transistor.

Dependency of resistance value on limited current value, at a moment at which a resistive change element changes from an off-resistive state to an on-resistive state will be explained next with reference to FIG. 12.

Figure 12:
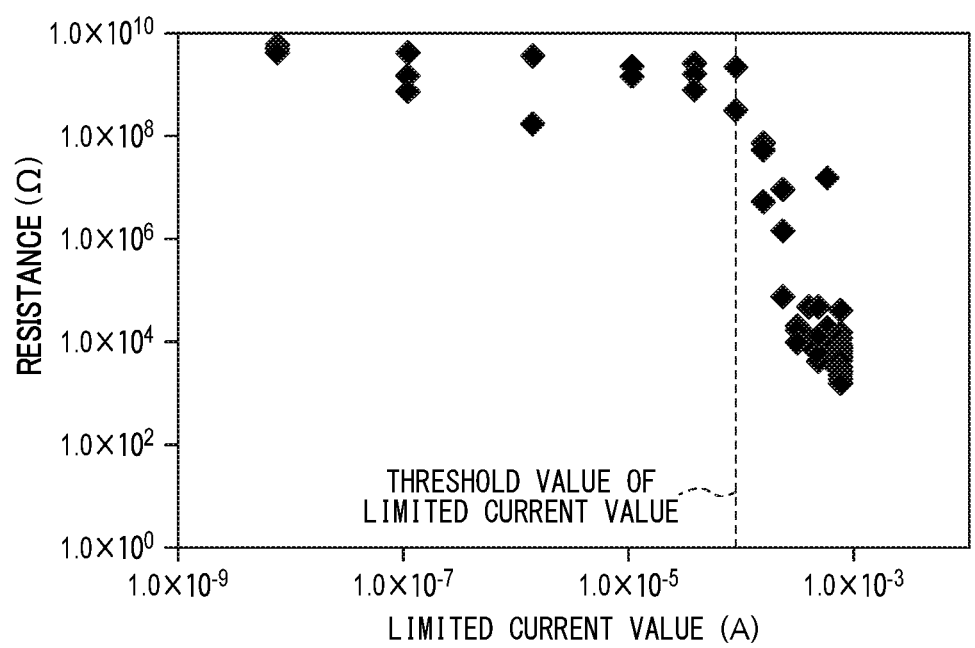
FIG. 12 is a diagram showing a result of measurements of the resistance value of a resistive change element after the setting operation under different current compliance.

FIG. 12 is a diagram showing a result of measurements of the resistance value of a resistive change element, after that the resistive change element is put into a state where currents of different limited current values flow through the resistive change element, followed by a set operation to apply a set voltage between two terminals of the resistive change element.

As understood from FIG. 12, when the limited current value is made equal to or smaller than a threshold value, the resistance value after the set operation shows almost no change. However, when the limited current value becomes larger than the threshold value, the resistance value after the set operation reduces as the limited current value becomes larger. Accordingly, the resistance value after the set operation is affected by the threshold value of the limited current value.

In view of above, in the present embodiment, a first to a third limited current value other than a fourth limited current value, which will be described later, are each set to be equal to or smaller than a threshold value, for the above-described current limiter $110_i$ (i=1, . . . , 10), the current limiter $210_j$ (j=1, . . . , 10), and the current limiter $211_j$ (j=1, . . . , 10).

Subsequently, a write operation, that is, a reset operation and a set operation, in the semiconductor integrated circuit of the present embodiment, will be explained. In this write operation, four kinds of first to fourth limited current values $I_{lim1}$ to $I_{lim4}$ are used. The first limited current value $I_{lim1}$ is used for the set operation, having a current value of, for example, 100 microamperes or smaller. The second limited current value $I_{lim2}$ is used for the reset operation, having a current value of, for example, several milliamperes or smaller. The third limited current value $I_{lim3}$ is used for erroneous operation prevention, having a current value of, for example, several nanoamperes or smaller. The fourth limited current value $I_{lim4}$ is used for simultaneous operation, having a current value of, for example, 10 milliamperes or smaller. The magnitude relation among the first to fourth limited current values are set as shown below.

$I_{lim4} > I_{lim2} > I_{lim1} > I_{lim3}$ (Reset Operation)

Figure 13:
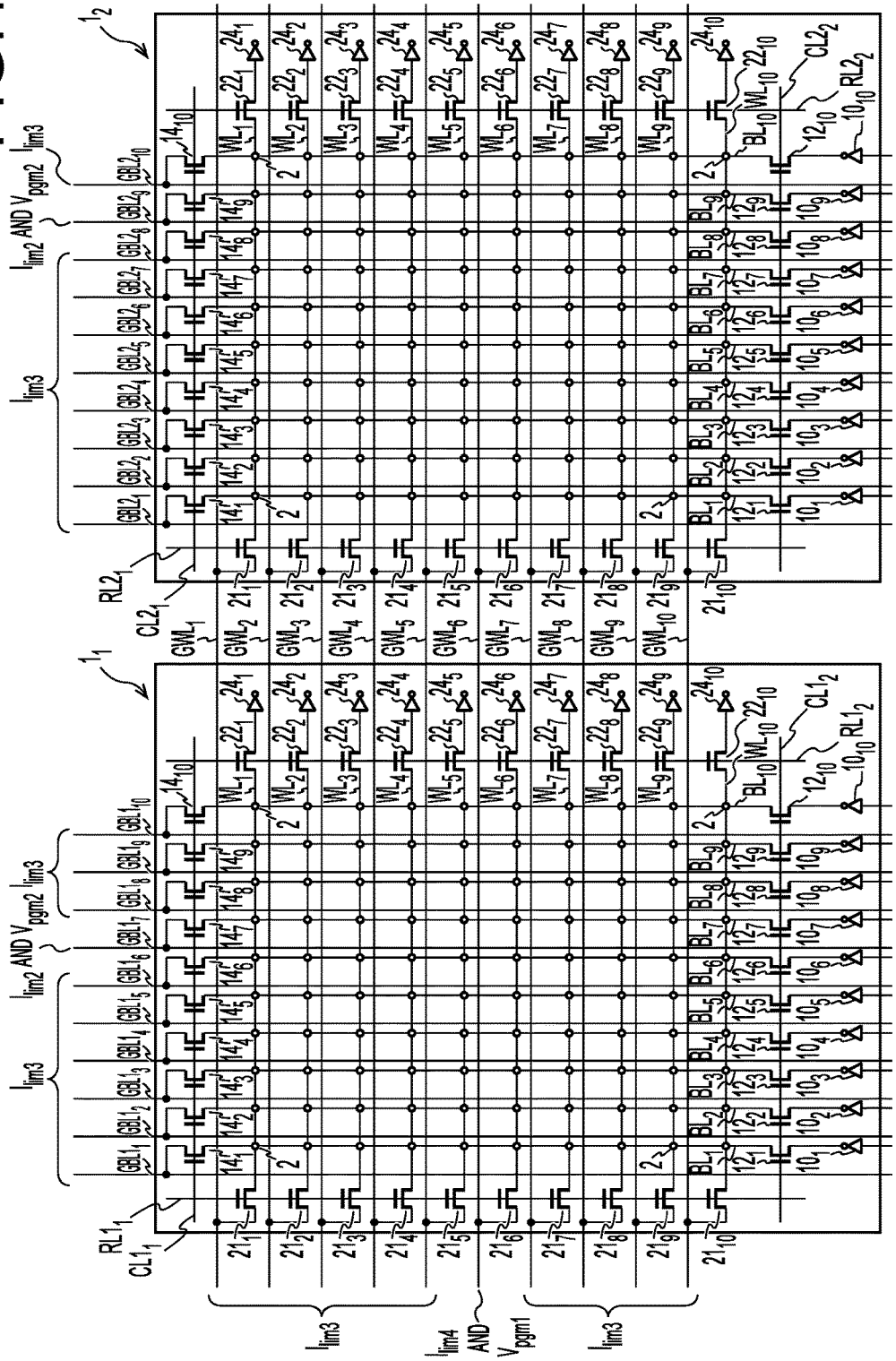
FIG. 13 is a diagram explaining a reset operation in the first embodiment.

The reset operation will be explained next with reference to FIG. 13. The reset operation will be explained with an example of the reset operation to a resistive change element 2 disposed in the sixth row and seventh column in the resistive change element array $1_1$ and to a resistive change element 2 disposed in the sixth row and ninth column in the resistive change element array $1_2$. In the semiconductor integrated circuit of the present embodiment, since the element arrays $1_1$ and $1_2$ are used in, for example, an FPGA (Field Programmable Gate Array), at most only one resistive change element 2 is in an ON state in the same row. In other words, in this explanation of the reset operation, among ten resistive change elements 2 arranged in the sixth row of the resistive change element array $1_1$, a resistive change element 2 disposed in the seventh column is in the ON state, and, among ten resistive change elements 2 arranged in the sixth row of the resistive change element array $1_2$, a resistive change element 2 disposed in the ninth column is in the ON state.

First of all, the controller 300 selects a driver $100_6$ and a current limiter $110_6$, and sends a control signal thereto to set the limited current value to the fourth limited current value $I_{lim4}$, and selects a global word line $GWL_6$ to make it possible to supply a current equal to or smaller than the fourth limited current value $I_{lim4}$ to the selected global word line $GWL_6$. Along with this, the controller 300 sends a control signal to non-selected drivers $100_1$ to $100_5$ and $100_7$ to $100_{10}$, and current limiters $110_1$ to $110_5$ and $110_7$ to $110_{10}$, to set the limited current value to the third limited current value $I_{lim3}$, and makes it possible to supply a current equal to or smaller than the third limited current value $I_{lim3}$ to non-selected global word lines $GWL_1$ to $GWL_5$ and $GWL_7$ to $GWL_{10}$.

The controller 300 sends control signals $CL1_1$ and $CL2_1$, and selects a driver $200_7$, a current limiter $210_7$, a driver $201_9$, and a current limiter $211_9$ to send a control signal thereto to set the limited current value to the second limited current value $I_{lim2}$, and selects global bit lines $GBL1_7$ and $GBL2_9$ to make it possible to supply a current equal to or smaller than the second limited current value $I_{lim2}$ to the selected global bit lines $GBL1_7$ and $GBL2_9$. Along with this, the controller 300 sends a control signal to non-selected drivers $200_1$, $200_6$ and $200_8$ to $200_{10}$, and current limiters $210_1$, $210_6$ and $210_8$ to $210_{10}$, and to non-selected drivers $201_1$ to $201_8$ and $201_{10}$, and current limiters $211_1$ to $211_8$ and $211_{10}$ to set the limited current value to the third limited current value $Ilim_3$, and to make it possible to supply a current equal to or smaller than the third limited current value $I_{lim3}$ to the non-selected global bit lines $GBL1_1$ to $GBL1_6$, $GBL1_8$ to $GBL1_{10}$, $GBL2_1$ to $GBL2_8$, and $GBL2_{10}$.

Moreover, the controller 300 selects the driver $100_6$ and the current limiter $110_6$ and sends a control signal thereto to select the global word line $GWL_6$ to make it possible to supply a program voltage Vpgm1 to the selected global word line $GWL_6$. Along with this, the controller 300 selects the driver $200_7$ and current limiter $210_7$, and the driver $201_9$ and current limiter $211_9$ to sends a control signal thereto to select the global bit lines $GBL1_7$ and $GBL2_9$ to make it possible to a supply program voltage Vpgm2 to the selected global bit lines $GBL1_7$ and $GBL2_9$. The voltages Vpgm1 and Vpgm2 are set so that an absolute value of the difference between the voltages Vpgm1 and Vpgm2 becomes equal to a reset voltage Vreset to the resistive change elements 2. In other words, the program voltages Vpgm1 and Vpgm2 are set to satisfy a relation $|Vpgm1 - Vpgm2| = Vreset$.

In the state described above, when the controller 300 activates the control signals $CL1_1$, $CL2_1$, $RL1_1$ and $RL2_1$, the cut-off transistors $14_1$ to $14_{10}$ and $21_1$ to $21_{10}$ of the element array $1_1$ and the cut-off transistors $14_1$ to $14_{10}$ and $21_1$ to $21_{10}$ of the element array $1_2$ are turned on to supply a current equal to or smaller than the fourth limited current value $I_{lim4}$ to the selected resistive change element 2 in the sixth row and seventh column of the element array $1_1$ and to the selected resistive change element 2 in the sixth row and ninth column of the element array $1_2$ from the word line $WL_6$. However, the current limiter $210_7$ electrically connected to the bit line $BL_7$ of the element array $1_1$ and the current limiter $211_9$ electrically connected to the bit line $BL_9$ of the element array $1_2$ are set at the second limited current value $I_{lim2}$. Therefore, the reset operation is performed to the selected resistive change element 2 in the sixth row and seventh column of the element array $1_1$ and to the selected resistive change element 2 in the sixth row and ninth column of the element array $1_2$, with the reset voltage Vreset being applied between the first and second terminals of each selected resistive change element and a current equal to or smaller than the second limited current value $I_{lim2}$ flowing between those first and second terminals.

To the non-selected resistive change elements 2, a current equal to or smaller than the third limited current value $I_{lim3}$ flows to restrict resistive change irrespective of a voltage applied to the non-selected resistive change elements 2. Accordingly, in the present embodiment, since the current is limited to be equal to or smaller than the third limited current value $I_{lim3}$, the voltage applied between the first and second terminals of each non-selected resistive change element is not limited to any particular voltage. In other words, the voltages applied to a non-selected global word line and a non-selected global bit line may not be a write inhibit voltage.

As explained above, it is possible to simultaneously perform the reset operation to resistive change elements 2 of the element arrays $1_1$ and $1_2$, the resistive change elements 2 being connected to the same global word line, to shorten the time for reset operation.

(Set Operation)

Figure 14:
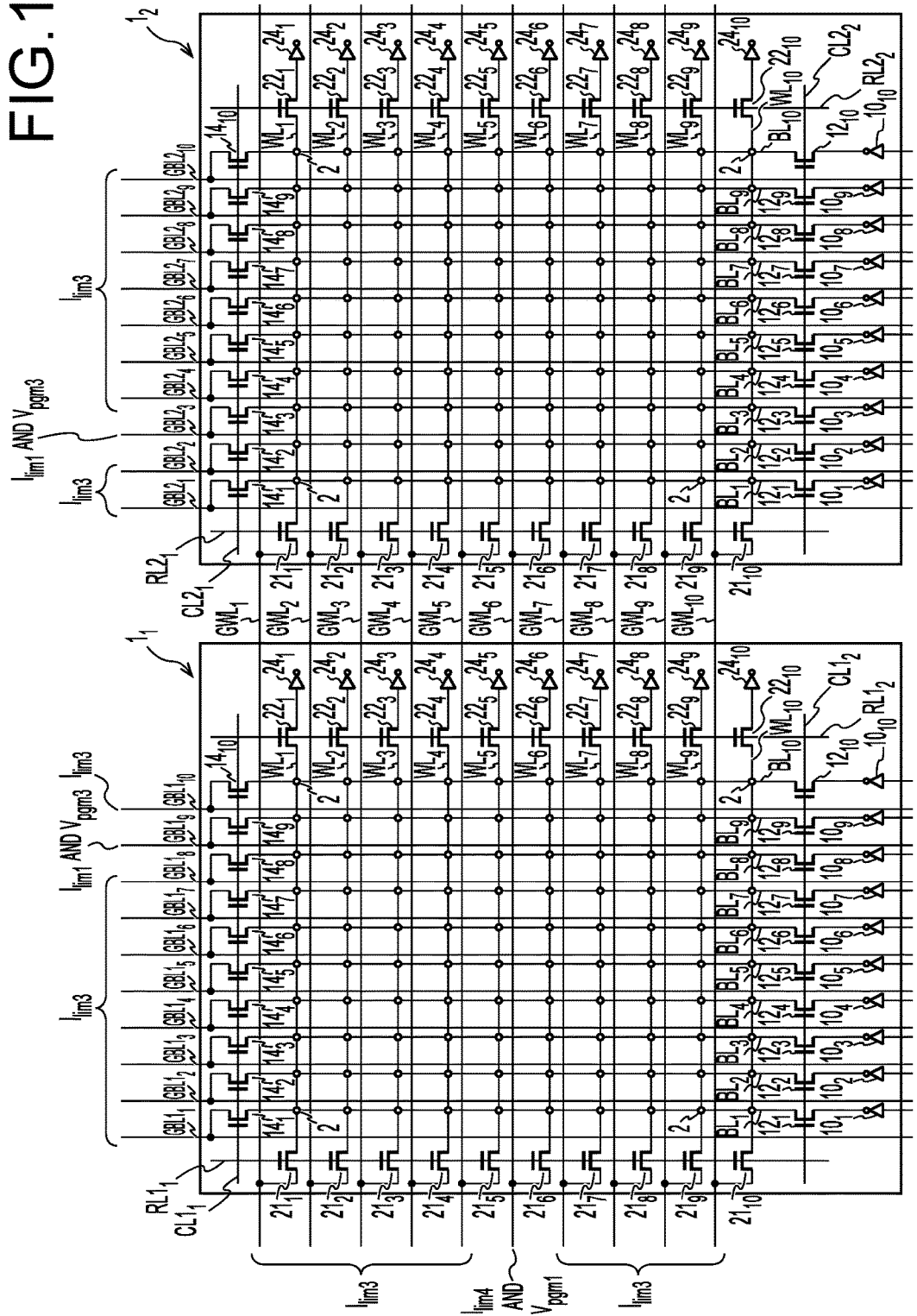
FIG. 14 is a diagram explaining a set operation in the first embodiment.

Subsequently, the set operation will be explained with reference to FIG. 14. The set operation will be explained with an example of the set operation to a resistive change element 2 disposed in the sixth row and ninth column in the resistive change element array $1_1$ and to a resistive change element 2 disposed in the sixth row and third column in the resistive change element array $1_2$.

First of all, the controller 300 selects the driver $100_6$ and the current limiter $110_6$ and sends a control signal thereto to set the limited current value to the fourth limited current value $I_{lim4}$, and selects the global word line $GWL_6$ to make it possible to supply a current equal to or smaller than the fourth limited current value $I_{lim4}$ to the selected global word line $GWL_6$. Along with this, the controller 300 sends a control signal to the non-selected drivers $100_1$ to $100_5$ and $100_7$ to $100_{10}$, and current limiters $110_1$ to $110_5$ and $110_7$ to $110_{10}$, to set the limited current value to the third limited current value $I_{lim3}$, and makes it possible to supply a current equal to or smaller than the third limited current value $I_{lim3}$ to the non-selected global word lines $GWL_1$ to $GWL_5$ and $GWL_7$ to $GWL_{10}$.

The controller 300 sends the control signals $CL1_1$ and $CL2_1$, and selects a driver $200_9$ and current limiter $210_9$, and a driver $201_3$ and current limiter $211_3$ to send a control signal thereto to set the limited current value to the first limited current value $I_{lim1}$, and selects global bit lines $GBL1_9$ and $GBL2_3$ to make it possible to supply a current equal to or smaller than the first limited current value $I_{lim1}$ to the selected global bit lines $GBL1_9$ and $GBL2_3$. Along with this, the controller 300 sends a control signal to non-selected drivers $200_1$ to $200_8$ and $200_{10}$, and current limiters $210_1$ to $210_8$ and $210_{10}$, and non-selected drivers $201_1$, $201_2$ and $201_4$ to $201_{10}$, and current limiters $211_1$, $211_2$ and $211_4$ to $211_{10}$ to set the limited current value to the third limited current value $I_{lim3}$, and to make it possible to supply a current equal to or smaller than the third limited current value $I_{lim3}$ to the non-selected global bit lines $GBL1_1$ to $GBL1_8$ and $GBL1_{10}$, and $GBL2_1$, $GBL2_2$ and $GBL2_4$ to $GBL2_{10}$.

The controller 300 selects the driver $100_6$ and current limiter $110_6$ and sends a control signal thereto to select the global word line $GWL_6$ to make it possible to supply a program voltage Vpgm1 to the selected global word line $GWL_6$. Along with this, the controller 300 selects the driver $200_7$ and current limiter $210_7$, and the driver $201_9$ and current limiter $211_9$ to sends a control signal thereto to select the global bit lines $GBL1_7$ and $GBL2_9$ to make it possible to a supply program voltage Vpgm3 to the selected global bit lines $GBL1_7$ and $GBL2_9$. The voltages $Vpgm_1$ and Vpgm3 are set so that an absolute value of the difference between the voltages Vpgm1 and Vpgm3 becomes equal to a set voltage Vset to the resistive change elements 2. In other words, the program voltages Vpgm1 and Vpgm2 are set to have a relation $$|Vpgm1-Vpgm3|=Vset.$$

In the state described above, when the controller 300 activates the control signals $CL1_1$, $CL2_1$, $RL1_1$ and $RL2_1$, the cut-off transistors $14_1$ to $14_{10}$ and $21_1$ to $21_{10}$ of the element array $1_1$ and the cut-off transistors $14_1$ to $14_{10}$ and $21_1$ to $21_{10}$ of the element array $1_2$ are turned on to supply a current equal to or smaller than the fourth limited current value $I_{lim4}$ to the selected resistive change element 2 in the sixth row and ninth column of the element array $1_1$ and to the selected resistive change element 2 in the sixth row and third column of the element array $1_2$ from the word line $WL_6$. However, the current limiter $210_9$ electrically connected to the bit line $BL_9$ of the element array $1_1$ and the current limiter $211_3$ electrically connected to the bit line $BL_3$ of the element array $1_2$ are set to the first limited current value $I_{lim1}$. Therefore, the set operation is performed to the selected resistive change element 2 in the sixth row and ninth column of the element array $1_1$ and to the selected resistive change element 2 in the sixth row and third column of the element array $1_2$ with the set voltage Vset being applied between the first and second terminals of each selected resistive change element and a current equal to or smaller than the first limited current value $I_{lim1}$ flowing between those terminals.

To the non-selected resistive change elements 2, a current equal to or smaller than the third limited current value $I_{lim3}$ flows to restrict resistive change irrespective of a voltage applied to the non-selected resistive change elements 2. Accordingly, in the present embodiment, since the current is limited to be equal to or smaller than the third limited current value $I_{lim3}$, the voltage applied between the first and second terminals of each non-selected resistive change element is not limited to any particular voltage. In other words, the voltages applied to a non-selected global word line and a non-selected global bit line may not be a write inhibit voltage.

As explained above, it is possible to simultaneously perform the set operation to resistive change elements 2 of the element arrays $1_1$ and $1_2$, the resistive change elements 2 being connected to the same global word line, to shorten the time for set operation.

(Regular Operation)

Subsequently, a regular operation will be explained with reference to FIG. 1. In this case, in each of the element arrays $1_1$ and $1_2$, among a plurality of resistive change elements 2 in one row, that is, connected to the same word line, at most one resistive change element 2 is in the low resistive state and the other resistive change elements are in the high resistive state.

In the state described above, an input signal is externally input to the inverters $10_1$ to $10_{10}$ of the element array $1_1$ and to the inverters $10_1$ to $10_{10}$ of the element array $1_2$. Then, the element arrays $1_1$ and $1_2$ each output information stored in the resistive change elements 2 in the i-th row of each element array from an output terminal of an inverter $24_i$ (i=1, . . . , 10). In this way, information stored in the resistive change elements 2 of the element arrays $1_1$ and $1_2$ are read out to complete the regular operation.

In the first embodiment, the element arrays $1_1$ and $1_2$ each include the resistive change elements arranged in ten rows and ten columns. When m and n are an integer of 2 or more, the element arrays $1_1$ and $1_2$ each may include resistive change elements arranged in m rows and n columns. The element arrays $1_1$ and $1_2$ include the same number of resistive change elements arranged in the row direction, however, may include different numbers of resistive change elements arranged in the column direction.

As explained above, the first embodiment can provide a semiconductor integrated circuit capable of reducing a write time even having large-scale resistive change element arrays.

Modification

Figure 15:
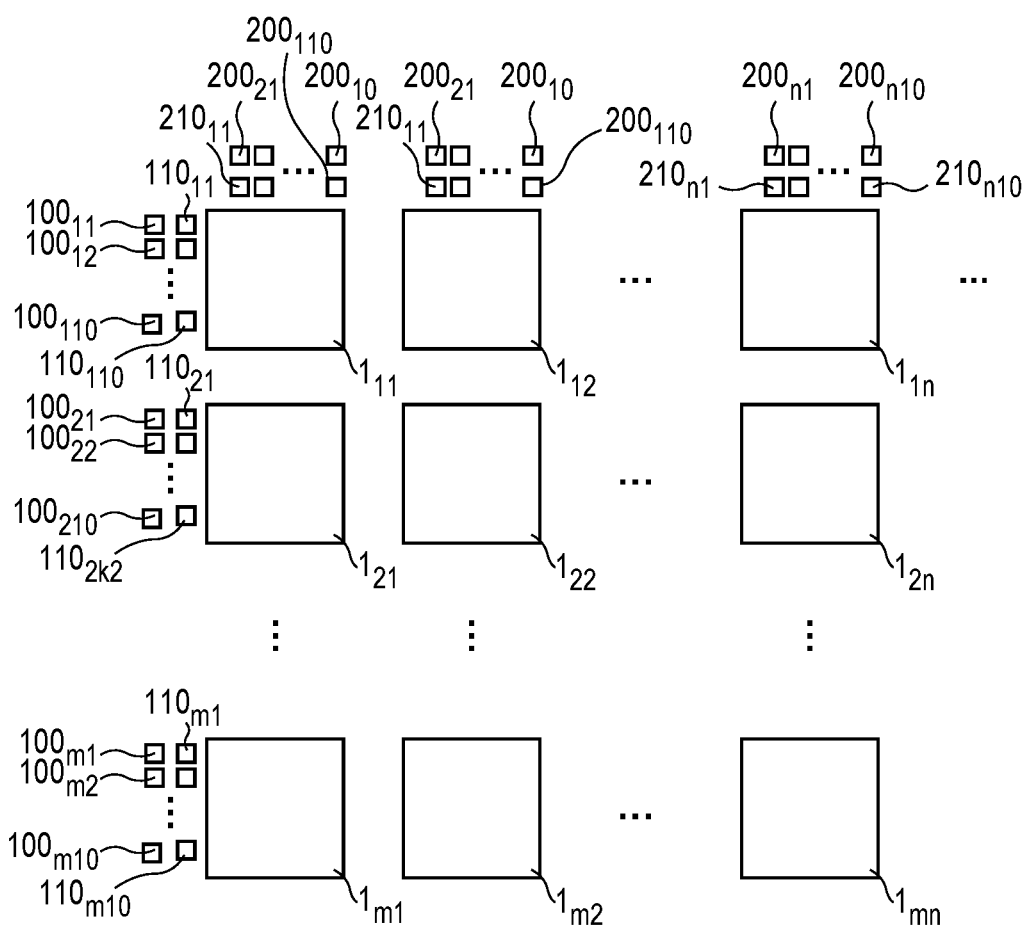
FIG. 15 is a block diagram showing a semiconductor integrated circuit according to a modification of the first embodiment.

FIG. 15 shows a semiconductor integrated circuit according to a modification of the first embodiment. In the semiconductor integrated circuit according to the first embodiment, the element arrays are arranged in one row and two columns or in m rows and two columns when m is an integer of 2 or more. The semiconductor integrated circuit of the modification include element arrays $1_{11}$ to $1_{mn}$ arranged in m rows and n columns, and the controller 300 shown in FIG. 1, when m and n are an integer of 2 or more. Each element array $1_{ij}$ (i=1, . . . , m, j=1, . . . , n) include the same configuration as the element arrays $1_1$ and $1_2$ of the first embodiment shown in FIG. 1. In detail, each element array $1_{ij}$ (i=1, . . . , m, j=1, . . . , n) includes resistive change elements 2 arranged in 10 rows and 10 columns, inverters $10_1$ to $10_{10}$, cut-off transistors $12_1$ to $12_{10}$, cut-off transistors $14_1$ to $14_{10}$, cut-off transistors $21_1$ to $21_{10}$, cut-off transistors $22_1$ to $22_{10}$, inverters $24_1$ to $24_{10}$, word lines $WL_1$ to $WL_{10}$, and bit lines $BL_1$ to $BL_{10}$.

Furthermore, the semiconductor integrated circuit of the modification includes drivers $100_{i1}$ to $100_{i10}$ shared by element arrays $1_{i1}$ to $1_{in}$ in the i-th (i=1, . . . , m) row and with current limiters $110_{i1}$ to $110_{i10}$. Moreover, the semiconductor integrated circuit of the modification includes drivers $200_{1j}$ to $200_{10j}$ shared by element arrays $1_{1j}$ to $1_{nj}$ in the j-th (j=1, ..., n) column and with current limiters $210_{1j}$ to $210_{10j}$. Drivers $100_{i1}$ to $100_{m10}$ each include the same configuration as the driver $100_i$ (i=1, ..., 10) of the first embodiment. Current limiters $110_{i1}$ to $110_{m10}$ each include the same configuration as the current limiter $110_i$ (i=1, ..., 10) of the first embodiment. The drivers $100_{i1}$ to $100_{i10}$ arranged so as to be shared by the element arrays $1_{i1}$ to $1_{in}$ in the i-th row drive the current limiters $110_{i1}$ to $110_{i10}$, respectively, based on a control signal from the controller 300 shown in FIG. 1.

Drivers $200_{11}$ to $200_{n10}$ each include the same configuration as the driver $200_i$ or $201_i$ (i=1, ..., 10) of the first embodiment. Current limiters $210_{11}$ to $210_{n10}$ each include the same configuration as the current limiter $210_i$ or $211_i$ (i=1, ..., 10) of the first embodiment. The drivers $200_{11}$ to $200_{n10}$ drive the current limiters $210_{11}$ to $210_{n10}$, respectively, based on a control signal from the controller 300 shown in FIG. 1.

In the semiconductor integrated circuit of the modification, and in each of element arrays $1_{i1}$ to $1_{in}$ in the i-th (i=1, ..., n) row, the first terminal of a resistive change element 2 in the k-th (k=1, ..., 10) row is connected to a word line $WL_k$ that is, in the same manner as the first embodiment, connected to a global word line (not shown) disposed to be shared by the element arrays $1_{i1}$ to $1_{in}$ in the i-th row via a cut-off transistor $21_k$. Moreover, in each of element arrays $1_{1j}$ to $1_{mj}$ in the j-th (j=1, ..., m) column, the second terminal of a resistive change element 2 in the k-th (k=1, ..., 10) column is connected to a bit line $BL_k$ that is connected to a global word line (not shown) disposed to be shared by the element arrays $1_{1j}$ to $1_{mj}$ in the j-th column via a cut-off transistor $14_k$.

The set and reset operations in the semiconductor integrated circuit of the modification can be done in the same manner as the first embodiment.

In the modification, each of the element arrays $1_{11}$ to $1_{mn}$ includes resistive change elements arranged in ten rows and ten columns. When, m and n are an integer of 2 or more, each of the element arrays $1_{11}$ to $1_{mn}$ may include resistive change elements arranged in m rows and n columns.

In the same manner as the first embodiment, the modification can provide a semiconductor integrated circuit capable of reducing a write time even including large-scale resistive change element arrays.

Second Embodiment

Subsequently, a semiconductor integrated circuit according to a second embodiment will be explained with reference to FIG. 16. Although including the same configuration as the semiconductor integrated circuit shown in FIG. 1, the semiconductor integrated circuit of the second embodiment includes a configuration for simultaneous set and reset operations to two resistive change elements in the same row of element arrays $1_1$ and $1_2$. FIG. 16 is a figure explaining an example in which the reset operation is performed to a resistive change element 2 in the sixth row and seventh column of the element array $1_1$ and the set operation is performed to a resistive change element 2 in the sixth row and tenth column of the element array $1_1$, and the set operation is performed to a resistive change element 2 in the sixth row and third column of the element array $1_2$ and the reset operation is performed to a resistive change element 2 in the sixth row and ninth column of the element array $1_2$. In FIG. 16, the controller 300, drivers $100_1$ to $100_{10}$, current limiters $110_1$ to $110_{10}$, drivers $200_1$ to $200_{10}$, drivers $201_1$ to $201_{10}$, current limiters $210_1$ to $210_{10}$, and current limiters $211_1$ to $211_{10}$ are omitted.

First of all, the controller 300 selects a driver $100_6$ and a current limiter $110_6$ and sends a control signal thereto to set the limited current value to the fourth limited current value $I_{lim4}$, and selects a global word line $GWL_6$ to make it possible to supply a current equal to or smaller than the fourth limited current value $I_{lim4}$ to the selected global word line $GWL_6$. Along with this, the controller 300 sends a control signal to non-selected drivers $100_1$ to $100_5$ and $100_7$ to $100_{10}$, and current limiters $110_1$ to $110_5$ and $110_7$ to $110_{10}$, to set the limited current value to the third limited current value $I_{lim3}$, and makes it possible to supply a current equal to or smaller than the third limited current value $I_{lim3}$ to non-selected global word lines $GWL_1$ to $GWL_5$ and $GWL_7$ to $GWL_{10}$.

The controller 300 sends control signals $CL1_1$ and $CL2_1$, and selects a driver $200_7$ and current limiter $210_7$, and a driver $201_9$ and current limiter $211_9$ to send a control signal thereto to set the limited current value to the second limited current value $I_{lim2}$, and selects global bit lines $GBL1_7$ and $GBL2_9$ to make it possible to supply a current equal to or smaller than the second limited current value $I_{lim2}$ to the selected global bit lines $GBL1_7$ and $GBL2_9$. Along with this, the controller 300 selects a driver $200_{10}$ and current limiter $210_{10}$, and a driver $201_3$ and current limiter $211_3$, and send a control signal thereto to set the limited current value to the first limited current value $I_{lim1}$ and selects global bit lines $GBL1_{10}$ and $GBL2_3$ to make it possible to supply a current equal to or smaller than the first limited current value $I_{lim1}$, to the selected global bit lines $GBL1_{10}$ and $GBL2_3$.

Moreover, the controller 300 sends a control signal to non-selected drivers $200_1$ to $200_6$, $200_8$ and $200_9$, and current limiters $210_1$ to $210_6$, $210_8$ and $210_9$, and non-selected drivers $201_1$, $201_2$, $201_4$ to $201_8$ and $201_{10}$ and current limiters $211_1$, $211_2$, $211_4$ to $211_8$ and $211_0$ to set the limited current value to the third limited current value $I_{lim3}$, and make it possible to supply a current equal to or smaller than the third limited current value $I_{lim3}$ to non-selected global bit lines $GBL1_1$ to $GBL1_6$, $GBL1_8$, $GBL1_9$, $GBL2_1$, $GBL2_2$, $GBL2_4$ to $GBL2_8$, and $GBL2_{10}$.

Furthermore, the controller 300 selects the driver $100_6$ and current limiter $110_6$ to send a control signal thereto to select the global word line $GWL_6$ to make it possible to supply a program voltage Vpgm1 to the selected global word line $GWL_6$. Along with this, the controller 300 selects the driver $200_7$ and current limiter $210_7$, and the driver $201_9$ and current limiter $211_9$ to send a control signal thereto to select the global bit lines $GBL1_7$ and $GBL2_9$ to make it possible to supply a program voltage Vpgm2 to the selected global bit lines $GBL1_7$ and $GBL2_9$. The voltages Vpgm1 and Vpgm2 are set so that an absolute value of the difference between the voltages Vpgm1 and Vpgm2 becomes equal to a reset voltage Vreset to the resistive change elements 2. In other words, the program voltages Vpgm1 and Vpgm2 are set to have a relation

|Vpgm1−Vpgm2|=Vreset.

At the same time, the controller 300 selects a driver $200_{10}$ and current limiter $210_{10}$, and a driver $201_3$ and a current limiter $211_3$ to send a control signal thereto to select global word lines $GWL1_{10}$ and $GWL2_3$ to make it possible to supply a program voltage Vpgm3 to the selected global word lines $GWL1_{10}$ and $GWL2_3$. The voltages Vpgm1 and Vpgm3 are set so that an absolute value of the difference between the voltages Vpgm1 and Vpgm3 becomes equal to a set voltage Vset to the resistive change elements 2. In other words, the program voltages Vpgm1 and Vpgm3 are set to have a relation $$|Vpgm1 - Vpgm3| = Vset.$$

In the state described above, when the controller 300 activates the control signals $CL1_1$, $CL2_1$, $RL1_1$ and $RL2_1$, the cut-off transistors $14_1$ to $14_{10}$ and $21_1$ to $21_{10}$ of the element array $1_1$ and the cut-off transistors $14_1$ to $14_{10}$ and $21_1$ to $21_{10}$ of the element array $1_2$ are turned on to supply a reset voltage Vreset between the first and second terminals of a selected resistive change element 2 in the sixth row and seventh column of the element array $1_1$ and of a selected resistive change element 2 in the sixth row and ninth column of the element array $1_2$ to perform the reset operation. At the same time, a set voltage Vset is applied between the first and second terminals of a selected resistive change element 2 in the sixth row and tenth column of the element array $1_1$ and of a selected resistive change element 2 in the sixth row and third column of the element array $1_2$ to perform the set operation.

As explained above, according to the present embodiment, it is possible to simultaneously perform the set and reset operations to two resistive change elements in the same row of the element arrays $1_1$ and $1_2$.

In the semiconductor integrated circuit of the second embodiment, although the element arrays are arranged in one row and two columns, when m and n are an integer of 2 or more, element arrays arranged in m rows and n columns may be provided, like the modification of the first embodiment. In the same manner as the first embodiment and the modification thereof, the second embodiment can provide a semiconductor integrated circuit capable of reducing a write time even having large-scale resistive change element arrays.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor integrated circuit comprising:
first wirings;
second wirings intersecting with the first wirings, respectively;
third wirings intersecting with the first wirings, respectively;
first current limiters arranged to correspond to the first wirings, at least one of the first current limiters being connected to corresponding one of the first wirings;
second current limiters arranged to correspond to the second wirings, at least one of the second current limiters being connected to corresponding one of the second wirings;
third current limiters arranged to correspond to the third wirings, at least one of the third current limiters being connected to corresponding one of the third wirings;
first drivers arranged to correspond to the first current limiters, at least one of the first drivers being connected to corresponding one of the first current limiters;
second drivers arranged to correspond to the second current limiters, at least one of the second drivers being connected to corresponding one of the second current limiters;
third drivers arranged to correspond to the third current limiters, at least one of the third drivers being connected to corresponding one of the third current limiter; and
a first array and a second array,
wherein the first array comprises:
fourth wirings arranged to correspond to the first wirings;
fifth wirings arranged to correspond to the second wirings, the fifth wirings intersecting with the fourth wirings, respectively;
first transistors arranged to correspond to the first wirings, one of a source and drain of at least one of the first transistors being connected to corresponding one of the first wirings, the other of the source and drain of the at least one of the first transistors being connected to corresponding one of the fourth wirings;
second transistors arranged to correspond to the second wirings, one of a source and drain of at least one of the second transistors being connected to corresponding one of the second wirings, the other of the source and drain of the at least one of the second transistors being connected to corresponding one of the fifth wirings; and
first resistive change elements arranged in intersecting areas of the fourth wirings and the fifth wirings, respectively, at least one of the first resistive change elements including a first terminal connected to corresponding one of the fourth wirings and a second terminal connected to corresponding one of the fifth wirings; and
the second array comprises:
sixth wirings arranged to correspond to the first wirings;
seventh wirings arranged to correspond to the third wirings, the seventh wirings intersecting with the sixth wirings, respectively;
third transistors arranged to correspond to the first wirings, one of a source and drain of at least one of the third transistors being connected to corresponding one of the first wirings, the other of the source and drain of the at least one of the third transistors being connected to corresponding one of the sixth wirings;
fourth transistors arranged to correspond to the third wirings, one of a source and drain of at least one of the fourth transistors being connected to corresponding one of the third wirings, the other of the source and drain of the at least one of the fourth transistors being connected to corresponding one of the seventh wirings; and
second resistive change elements arranged in intersecting areas of the sixth wirings and the seventh wirings, respectively, at least one of the second resistive change elements including a third terminal connected to corresponding one of the sixth wirings and a fourth terminal connected to corresponding one of the seventh wirings,
wherein the second current limiters have first to third limited current values, respectively, one of the first to third limited current values being selected by corresponding one of the second drivers to limit a current flowing through corresponding one of the second wirings to the one selected from the first to third limited current values or smaller,
the third current limiters have the first to third limited current values, respectively, one of the first to third limited current values being selected by corresponding one of the third drivers to limit a current flowing through corresponding one of the third wirings to the one selected from the first to third limited current values or smaller, the first current limiters have the third limited current value and a fourth limited current value respectively, one of the third and fourth limited current values being selected by corresponding one of the first drivers to limit a current flowing through corresponding one of the first wirings to the one selected from the third and fourth limited current values or smaller, and the third limited current value is smaller than the first limited current value, the first limited current value is smaller than the second limited current value, and the second limited current value is smaller than the fourth limited current value.

2. The semiconductor integrated circuit according to claim 1, wherein the first array further comprises first inverters disposed to correspond to the fifth wirings and second inverters disposed to correspond to the fourth wirings, at least one of the first inverters including an input terminal to receive an input signal and an output terminal connected to corresponding one of the fifth wirings, at least one of the second inverters including an input terminal connected to corresponding one of the fourth wirings and an output terminal to output an output signal, and the second array further comprises third inverters disposed to correspond to the seventh wirings and fourth inverters disposed to correspond to the sixth wirings, at least one of the third inverters including an input terminal to receive an input signal and an output terminal connected to corresponding one of the seventh wirings, the fourth inverter including an input terminal connected to corresponding one of the sixth wirings and an output terminal to output an output signal.

3. The semiconductor integrated circuit according to claim 1 further comprising:

eighth wirings intersecting with the second wirings and the third wirings, respectively; and a third array and a fourth array, wherein the third array comprises:

ninth wirings arranged to correspond to the eighth wirings;

tenth wirings arranged to correspond to the second wirings, the tenth wirings intersecting with the ninth wirings, respectively;

fifth transistors arranged to correspond to the eighth wirings, one of a source and drain of at least one of the fifth transistors being connected to corresponding one of the eighth wirings, the other of the source and drain of the at least one of the fifth transistors being connected to corresponding one of the ninth wirings;

sixth transistors arranged to correspond to the second wirings, one of a source and drain of at least one of the sixth transistors being connected to corresponding one of the second wirings, the other of the source and drain of the at least one of the sixth transistors being connected to corresponding one of the tenth wirings; and third resistive change elements arranged in intersecting areas of the ninth wirings and the tenth wirings, respectively, at least one of the third resistive change elements including a fifth terminal connected to corresponding one of the ninth wirings and including a sixth terminal connected to corresponding one of the tenth wirings; and the fourth array comprises:

eleventh wirings arranged to correspond to the eighth wirings;

twelfth wirings arranged to correspond to the third wirings, the twelfth wirings intersecting with the eleventh wirings, respectively;

seventh transistors arranged to correspond to the eighth wirings, one of a source and drain of at least one of the seventh transistors being connected to corresponding one of the eighth wirings, the other of the source and drain of the at least one of the seventh transistors being connected to corresponding one of the eleventh wirings;

eighth transistors arranged to correspond to the third wirings, one of a source and drain of at least one of the eighth transistors being connected to corresponding one of the third wirings, the other of the source and drain of the at least one of the eighth transistors being connected to corresponding one of the twelfth wirings; and fourth resistive change elements arranged in intersecting areas of the eleventh wirings and the twelfth wirings, respectively, at least one of the fourth resistive change elements including a seventh terminal connected to corresponding one of the eleventh wirings and an eighth terminal connected to corresponding one of the eleventh wirings.

4. The semiconductor integrated circuit according to claim 3, wherein the third array further comprises fifth inverters disposed to correspond to the tenth wirings and sixth inverters disposed to correspond to the ninth wirings, at least one of the fifth inverters including an input terminal to receive an input signal and an output terminal connected to corresponding one of the tenth wirings, at least one of the sixth inverters including an input terminal connected to corresponding one of the ninth wirings and an output terminal to output an output signal, and the fourth array further comprises seventh inverters disposed to correspond to the twelfth wirings and eighth inverters disposed to correspond to the eleventh wirings, at least one of the seventh inverters including an input terminal to receive an input signal and an output terminal connected to corresponding one of the twelfth wirings, at least one of the eighth inverters including an input terminal connected to corresponding one of the eleventh wirings and an output terminal to output an output signal.

5. The semiconductor integrated circuit according to claim 1 further comprising a controller to control the first to third current limiters and the first to third drivers, the controller being connected to gates of the first to fourth transistors.

6. A semiconductor integrated circuit comprising:

first wirings:

second wirings intersecting with the first wirings, respectively;

third wirings intersecting with the first wirings, respectively;

first current limiters arranged to correspond to the first wirings, at least one of the first current limiters being connected to corresponding one of the first wirings;

second current limiters arranged to correspond to the second wirings, at least one of the second current limiters being connected to corresponding one of the second wirings;

third current limiters arranged to correspond to the third wirings, at least one of the third current limiters being connected to corresponding one of the third wirings;

first drivers arranged to correspond to the first current limiters, at least one of the first drivers being connected to corresponding one of the first current limiters:
second drivers arranged to correspond to the second current limiters, at least one of the second drivers being connected to corresponding one of the second current limiters;
third drivers arranged to correspond to the third current limiters, at least one of the third drivers being connected to corresponding one of the third current limiter;
a controller configured to control the first to third current limiters and the first to third drivers; and
a first array and a second array,
wherein the first array comprises:
fourth wirings arranged to correspond to the first wirings;
fifth wirings arranged to correspond to the second wirings, the fifth wirings intersecting with the fourth wirings, respectively;
first transistors arranged to correspond to the first wirings, one of a source and drain of at least one of the first transistors being connected to corresponding one of the first wirings, the other of the source and drain of the at least one of the first transistors being connected to corresponding one of the fourth wirings;
second transistors arranged to correspond to the second wirings, one of a source and drain of at least one of the second transistors being connected to corresponding one of the second wirings, the other of the source and drain of the at least one of the second transistors being connected to corresponding one of the fifth wirings; and
first resistive change elements arranged in intersecting areas of the fourth wirings and the fifth wirings, respectively, at least one of the first resistive change elements including a first terminal connected to corresponding one of the fourth wirings and a second terminal connected to corresponding one of the fifth wirings; and
the second array comprises:
sixth wirings arranged to correspond to the first wirings;
seventh wirings arranged to correspond to the third wirings, the seventh wirings intersecting with the sixth wirings, respectively;
third transistors arranged to correspond to the first wirings, one of a source and drain of at least one of the third transistors being connected to corresponding one of the first wirings, the other of the source and drain of the at least one of the third transistors being connected to corresponding one of the sixth wirings;
fourth transistors arranged to correspond to the third wirings, one of a source and drain of at least one of the fourth transistors being connected to corresponding one of the third wirings, the other of the source and drain of the at least one of the fourth transistors being connected to corresponding one of the seventh wirings; and
second resistive change elements arranged in intersecting areas of the sixth wirings and the seventh wirings, respectively, at least one of the second resistive change elements including a third terminal connected to corresponding one of the sixth wirings and a fourth terminal connected to corresponding one of the seventh wirings,
wherein the controller is connected to gates of the first to fourth transistors, and
wherein, when a set operation is performed to one of the first resistive change elements in the first array and to one of the second resistive change elements in the second array, the controller selects one of the first wirings connected to the first terminal of the one of the first resistive change elements and to the third terminal of the one of the second resistive change elements, selects one of the second wirings connected to the second terminal of the one of the first resistive change elements, and selects one of the third wirings connected to the fourth terminal of the one of the second resistive change elements,
the controller applies a first voltage to the one selected from the first wirings via one of the first drivers and one of the first current limiters each corresponding to the one selected from the first wirings, and feeds a current equal to or smaller than the fourth limited current value to the one selected from the first wirings,
the controller applies a second voltage to the one selected from the second wirings via one of the second drivers and one of the second current limiters each corresponding to the one selected from the second wirings, and feeds a current equal to or smaller than the first limited current value to the one selected from the second wirings,
the controller applies the second voltage to the one selected from the third wirings via one of the third drivers and one of the third current limiters each corresponding to the one selected from the third wirings and feeds a current equal to or smaller than the first limited current value to the one selected from the third wirings, feeds a current equal to or smaller than the third limited current value to a non-selected first wiring via one of the first drivers and one of the first current limiters each corresponding to the non-selected first wiring, feeds a current equal to or smaller than the third limited current value to a non-selected second wiring via one of the second drivers and one of the second current limiters each corresponding to the non-selected second wiring, and feeds a current equal to or smaller than the third limited current value to a non-selected third wiring via one of the third drivers and one of the third current limiters each corresponding to the non-selected third wiring, an absolute value of a difference between the first and second voltages being a set voltage.

7. A semiconductor integrated circuit comprising:
first wirings;
second wirings intersecting with the first wirings, respectively;
third wirings intersecting with the first wirings, respectively;
first current limiters arranged to correspond to the first wirings, at least one of the first current limiters being connected to corresponding one of the first wirings;
second current limiters arranged to correspond to the second wirings, at least one of the second current limiters being connected to corresponding one of the second wirings;
third current limiters arranged to correspond to the third wirings, at least one of the third current limiters being connected to corresponding one of the third wirings;
first drivers arranged to correspond to the first current limiters, at least one of the first drivers being connected to corresponding one of the first current limiters;
second drivers arranged to correspond to the second current limiters, at least one of the second drivers being connected to corresponding one of the second current limiters;

third drivers arranged to correspond to the third current limiters, at least one of the third drivers being connected to corresponding one of the third current limiter;

a controller configured to control the first to third current limiters and the first to third drivers; and a first array and a second array, wherein the first array comprises:

fourth wirings arranged to correspond to the first wirings;

fifth wirings arranged to correspond to the second wirings, the fifth wirings intersecting with the fourth wirings, respectively;

first transistors arranged to correspond to the first wirings, one of a source and drain of at least one of the first transistors being connected to corresponding one of the first wirings, the other of the source and drain of the at least one of the first transistors being connected to corresponding one of the fourth wirings;

second transistors arranged to correspond to the second wirings, one of a source and drain of at least one of the second transistors being connected to corresponding one of the second wirings, the other of the source and drain of the at least one of the second transistors being connected to corresponding one of the fifth wirings; and first resistive change elements arranged in intersecting areas of the fourth wirings and the fifth wirings, respectively, at least one of the first resistive change elements including a first terminal connected to corresponding one of the fourth wirings and a second terminal connected to corresponding one of the fifth wirings; and the second array comprises:

sixth wirings arranged to correspond to the first wirings;

seventh wirings arranged to correspond to the third wirings, the seventh wirings intersecting with the sixth wirings, respectively;

third transistors arranged to correspond to the first wirings, one of a source and drain of at least one of the third transistors being connected to corresponding one of the first wirings, the other of the source and drain of the at least one of the third transistors being connected to corresponding one of the sixth wirings;

fourth transistors arranged to correspond to the third wirings, one of a source and drain of at least one of the fourth transistors being connected to corresponding one of the third wirings, the other of the source and drain of the at least one of the fourth transistors being connected to corresponding one of the seventh wirings; and second resistive change elements arranged in intersecting areas of the sixth wirings and the seventh wirings, respectively, at least one of the second resistive change elements including a third terminal connected to corresponding one of the sixth wirings and a fourth terminal connected to corresponding one of the seventh wirings, wherein the controller is connected to gates of the first to fourth transistors, and wherein, when a reset operation is performed to one of the first resistive change elements in the first array and to one of the second resistive change elements in the second array, the controller selects one of the first wirings connected to the first terminal of the one of the first resistive change elements and to the third terminal of the one of the second resistive change elements, selects one of the second wirings connected to the second terminal of the one of the first resistive change elements, and selects one of the third wirings connected to the fourth terminal of the one of the second resistive change elements, applies a first voltage to the one selected from the first wirings via one of the first drivers and one of the first current limiters each corresponding to the one selected from the first wirings and feeds a current equal to or smaller than the fourth limited current value to the one selected from the first wirings, the controller applies a second voltage to the one selected from the second wirings via one of the second drivers and one of the second current limiters each corresponding to the one selected from the second wirings, and feeds a current equal to or smaller than the second limited current value to the one selected from the second wirings, the controller applies the second voltage to the one selected from the third wirings via one of the third drivers and one of the third current limiters each corresponding to the one selected from the third wirings, feeds a current equal to or smaller than the second limited current value to the one selected from the third wirings, feeds a current equal to or smaller than the third limited current value to a non-selected first wiring via one of the first drivers and one of the first current limiters each corresponding to the non-selected first wiring, feeds a current equal to or smaller than the third limited current value to a non-selected second wiring via one of the second drivers and one of the second current limiters each corresponding to the non-selected second wiring, and feeds a current equal to or smaller than the third limited current value to a non-selected third wiring via one of the third drivers and one of the third current limiters each corresponding to the non-selected third wiring, an absolute value of a difference between the first and second voltages being a reset voltage.

8. A semiconductor integrated circuit comprising:

first wirings;

second wirings intersecting with the first wirings, respectively; third wirings intersecting with the first wirings, respectively;

first current limiters arranged to correspond to the first wirings, at least one of the first current limiters being connected to corresponding one of the first wirings;

second current limiters arranged to correspond to the second wirings, at least one of the second current limiters being connected to corresponding one of the second wirings; third current limiters arranged to correspond to the third wirings, at least one of the third current limiters being connected to corresponding one of the third wirings;

first drivers arranged to correspond to the first current limiters, at least one of the first drivers being connected to corresponding one of the first current limiters;

second drivers arranged to correspond to the second current limiters, at least one of the second drivers being connected to corresponding one of the second current limiters;

third drivers arranged to correspond to the third current limiters, at least one of the third drivers being connected to corresponding one of the third current limiter;

a controller configured to control the first to third current limiters and the first to third drivers; and a first array and a second array,
wherein the first array comprises:
fourth wirings arranged to correspond to the first wirings;
fifth wiring arranged to correspond to the second wirings, the fifth wirings intersecting with the fourth wirings, respectively;
first transistors arranged to correspond to the first wirings, one of a source and drain of at least one of the first transistors being connected to corresponding one of the first wirings, the other of the source and drain of the at least one of the first transistors being connected to corresponding one of the fourth wirings;
second transistors arranged to correspond to the second wirings, one of a source and drain of at least one of the second transistors being connected to corresponding one of the second wirings, the other of the source and drain of the at least one of the second transistors being connected to corresponding one of the fifth wirings; and
first resistive change elements arranged in intersecting areas of the fourth wirings and the fifth wirings, respectively, at least one of the first resistive change elements including a first terminal connected to corresponding one of the fourth wirings and a second terminal connected to corresponding one of the fifth wirings; and
the second array comprises:
sixth wirings arranged to correspond to the first wirings;
seventh wirings arranged to correspond to the third wirings, the seventh wirings intersecting with the sixth wirings, respectively;
third transistors arranged to correspond to the first wirings, one of a source and drain of at least one of the third transistors being connected to corresponding one of the first wirings, the other of the source and drain of the at least one of the third transistors being connected to corresponding one of the sixth wirings;
fourth transistors arranged to correspond to the third wirings, one of a source and drain of at least one of the fourth transistors being connected to corresponding one of the third wirings, the other of the source and drain of the at least one of the fourth transistors being connected to corresponding one of the seventh wirings; and
second resistive change elements arranged in intersecting areas of the sixth wirings and the seventh wirings, respectively, at least one of the second resistive change elements including a third terminal connected to corresponding one of the sixth wirings and a fourth terminal connected to corresponding one of the seventh wirings,
wherein the controller is connected to gates of the first to fourth transistors, and
wherein, when a set operation and a reset operation are performed to one of and the other of two of the first resistive change elements, respectively, in the first array, and when a set operation and a reset operation are performed to one of and the other of two of the second resistive change elements, respectively, in the second array,
the controller selects one of the first wirings connected to the first terminal of each of the two of the first resistive change elements and to the third terminal of each of the two of the second resistive change elements, selects one of the second wirings connected to the second terminal of the one of the first resistive change elements, and selects one of the third wirings connected to the fourth terminal of the one of the second resistive change elements, the controller applies a first voltage to the selected one of the first wirings via one of the first drivers and one of the first current limiters each corresponding to the selected one of the first wirings and feeds a current equal to or smaller than the fourth limited current value to the one selected from the first wirings,
the controller applies a second voltage to the one selected from the second wirings via one of the second drivers and one of the second current limiters each corresponding to the one selected from the second wirings and feeds a current equal to or smaller than the first limited current value to the one selected from the second wirings, applies the second voltage to the one selected from the third wirings via one of the third drivers and one of the third current limiters each corresponding to the one selected from the third wirings and feeds a current equal to or smaller than the first limited current value to the one selected from the third wirings, feeds a current equal to or smaller than the third limited current value to a non-selected first wiring via one of the first drivers and one of the first current limiters each corresponding to the non-selected first wiring, feeds a current equal to or smaller than the third limited current value to a non-selected second wiring via one of the second drivers and one of the second current limiters each corresponding to the non-selected second wiring, and feeds a current equal to or smaller than the third limited current value to a non-selected third wiring via one of the third drivers and one of the third current limiters each corresponding to the non-selected third wiring, an absolute value of a difference between the first and second voltages being a set voltage, and
further, the controller selects one another second wiring connected to the second terminal of the other of the first resistive change elements and selects one another third wiring connected to the fourth terminal of the other of the second resistive change elements, applies a first voltage to the one selected from the first wirings via one of the first drivers and one of the first current limiters each corresponding to the one selected from the first wirings and feeds a current equal to or smaller than the fourth limited current value to the one selected from the first wirings,
the controller applies a third voltage to the one selected from the second wirings via one of the second drivers and one of the second current limiters each corresponding to the one selected from the second wirings and feeds a current equal to or smaller than the second limited current value to the one selected from the second wirings,
the controller applies the third voltage to the one selected from the third wirings via one of the third drivers and one of the third current limiters each corresponding to the one selected from the third wirings and feeds a current equal to or smaller than the second limited current value to the one selected from the third wirings, feeds a current equal to or smaller than the third limited current value to a non-selected first wiring via one of the first drivers and one of the first current limiters each corresponding to the non-selected first wiring, feeds a current equal to or smaller than the third limited current value to a non-selected second wiring via one of the second drivers and one of the second current limiters each corresponding to the non-selected second wiring, and feeds a current equal to or smaller than the third limited current value to a non-selected third wiring via one of the third drivers and one of the third current limiters each corresponding to the non-selected third wiring, an absolute value of a difference between the first and third voltages being a reset voltage.

\* \* \* \* \*